US010289343B2

(12) United States Patent
Yadav et al.

(10) Patent No.: US 10,289,343 B2
(45) Date of Patent: *May 14, 2019

(54) MEMORY DIE TEMPERATURE ADJUSTMENT BASED ON AGING CONDITION

(71) Applicant: Western Digital Technologies, Inc., San Jose, CA (US)

(72) Inventors: Preeti Yadav, Cupertino, CA (US); Prasanna Desai Sudhir Rao, San Ramon, CA (US); Smita Aggarwal, San Jose, CA (US); Dana Lee, Saratoga, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,330

(22) Filed: Jan. 22, 2018

(65) Prior Publication Data

US 2018/0143788 A1     May 24, 2018

Related U.S. Application Data

(63) Continuation of application No. 15/061,702, filed on Mar. 4, 2016, now Pat. No. 9,875,062, which is a
(Continued)

(51) Int. Cl.
*G11C 7/04* (2006.01)
*G06F 3/06* (2006.01)
(Continued)

(52) U.S. Cl.
CPC ......... *G06F 3/0659* (2013.01); *G06F 3/0616* (2013.01); *G06F 3/0653* (2013.01);
(Continued)

(58) Field of Classification Search
CPC ......... G11C 7/04; G11C 16/26; G11C 16/349; G06F 3/0659; G06F 3/0616; G06F 3/0653; G06F 3/0679
See application file for complete search history.

(56) References Cited

U.S. PATENT DOCUMENTS

| 7,426,649 B2 | 9/2008 | Brittain et al. |
| 7,996,725 B2 | 8/2011 | Nurminen et al. |

(Continued)

OTHER PUBLICATIONS

Wu, et al., "Exploiting Heat-Accelerated Flash Memory WEar-Out Recovery to Enable Self-Healing SSDs,"Usenix Workshop on Hot Topics in Storage and File Systems (HotStorage), Jun. 14, 2011, 5 pages.

(Continued)

*Primary Examiner* — Pho M Luu
(74) *Attorney, Agent, or Firm* — Patterson & Sheridan, LLP; Steven Versteeg

(57) ABSTRACT

A device includes a memory device and a controller. The controller is coupled to the memory device. The controller is configured to, in response to receiving a request to perform a memory access at the memory device, determine that the memory device has a characteristic indicative of a temperature crossing. The controller is also configured to, in response to the determination, increase a temperature of the memory device by performing memory operations on the memory device until detecting a condition related to the temperature.

20 Claims, 9 Drawing Sheets

Related U.S. Application Data continuation-in-part of application No. 14/867,999, filed on Sep. 28, 2015, now Pat. No. 9,983,922.

(51) Int. Cl.
 *G11C 16/26* (2006.01)
 *G11C 16/34* (2006.01)
(52) U.S. Cl.
 CPC .............. *G06F 3/0679* (2013.01); *G11C 7/04* (2013.01); *G11C 16/26* (2013.01); *G11C 16/349* (2013.01)

(56) References Cited

U.S. PATENT DOCUMENTS

| | | | |
|---|---|---|---|
| 8,590,332 B2 | 11/2013 | Wyatt | |
| 8,964,482 B2 | 2/2015 | Mu et al. | |
| 9,396,755 B2* | 7/2016 | Budiman | G11B 20/10527 |
| 9,852,067 B2* | 12/2017 | Kim | G06F 12/0253 |
| 9,875,062 B2* | 1/2018 | Yadav | G06F 3/0659 |
| 9,983,922 B2* | 5/2018 | Yadav | G06F 11/0793 |
| 2006/0285408 A1 | 12/2006 | Betser et al. | |
| 2010/0025811 A1 | 2/2010 | Bronner et al. | |
| 2010/0165689 A1 | 7/2010 | Rotbard et al. | |
| 2010/0329026 A1 | 12/2010 | Nakamura et al. | |
| 2012/0224425 A1 | 9/2012 | Fai et al. | |
| 2013/0194874 A1 | 8/2013 | Mu et al. | |
| 2017/0090784 A1 | 3/2017 | Reusswig et al. | |
| 2017/0091015 A1 | 3/2017 | Yadav et al. | |

OTHER PUBLICATIONS

Mohan, et al., reFresh SSDs: Enabling High Endurance, Low Cost Flash in Datacenters,: University of Virginia, Technical Report CS-2012-05, May 2012, 20 pages.
Search report and written opinion dated Apr. 6, 2017 for PCT/US2016/037015.

* cited by examiner

Prior to Write Access

| | First Case 602 | Second Case 604 | Third Case 606 |
|---|---|---|---|
| Write Temp. 546: | Write Temp 546 < First Temp. Threshold 542 | Write Temp 546 ≥ First Temp. Threshold 542 & Write Temp 546 ≤ Second Temp. Threshold 544 | Write Temp 546 > Second Temp. Threshold 544 |
| Temp. Crossing Condition 528: | Indicated | Not Indicated | Not Indicated |
| Actions: | ☐ Memory Operations 166 until Temp. 158 ≥ First Temp. Threshold 542<br>☐ Write Request 534 | ☐ Write Request 534 | ☐ Store Write Temp. 546 in Memory 140<br>☐ Write Request 534 |

FIG. 6

MEMORY DIE TEMPERATURE ADJUSTMENT BASED ON AGING CONDITION

CROSS-REFERENCE TO RELATED APPLICATIONS

This application is a continuation of U.S. patent application Ser. No. 15/061,702, filed Mar. 4, 2016, which issued as U.S. Pat. No. 9,875,062, which application is a continuation-in-part of U.S. patent application Ser. No. 14/867,999, filed Sep. 28, 2015, which issued as U.S. Pat. No. 9,983,922. Each of the aforementioned related patent applications is herein incorporated by reference.

BACKGROUND

Field

The present disclosure is generally related to electronic devices and more particularly to memory die temperature adjustment based on aging condition.

Description of the Related Art

Storage devices enable users to store and retrieve data. Examples of storage devices include volatile memory devices and non-volatile memory devices. Storage devices often include memory dies with program/erase cycles that degrade over time. For example, a storage device may include a memory die having a plurality of storage elements. A number of traps (e.g., oxide traps, interface traps, or both) may increase in the storage elements over time. A higher number of traps may increase a number of program pulses to program a storage element, a number of erase pulses to erase the storage element, or both.

A memory die may be marked as erroneous and unavailable for use in response to determining that a number of program pulses to program storage elements of the memory die is greater than a program threshold, that a number of erase pulses to erase the storage elements is greater than an erase threshold, or both. A storage capacity of the storage device may be reduced over time as a number of memory dies marked as erroneous in the storage device increases.

BRIEF DESCRIPTION OF THE DRAWINGS

FIG. 6 is a diagram of a particular illustrative example of conditions detected by the device of FIG. 5;

DETAILED DESCRIPTION

Figure 1:
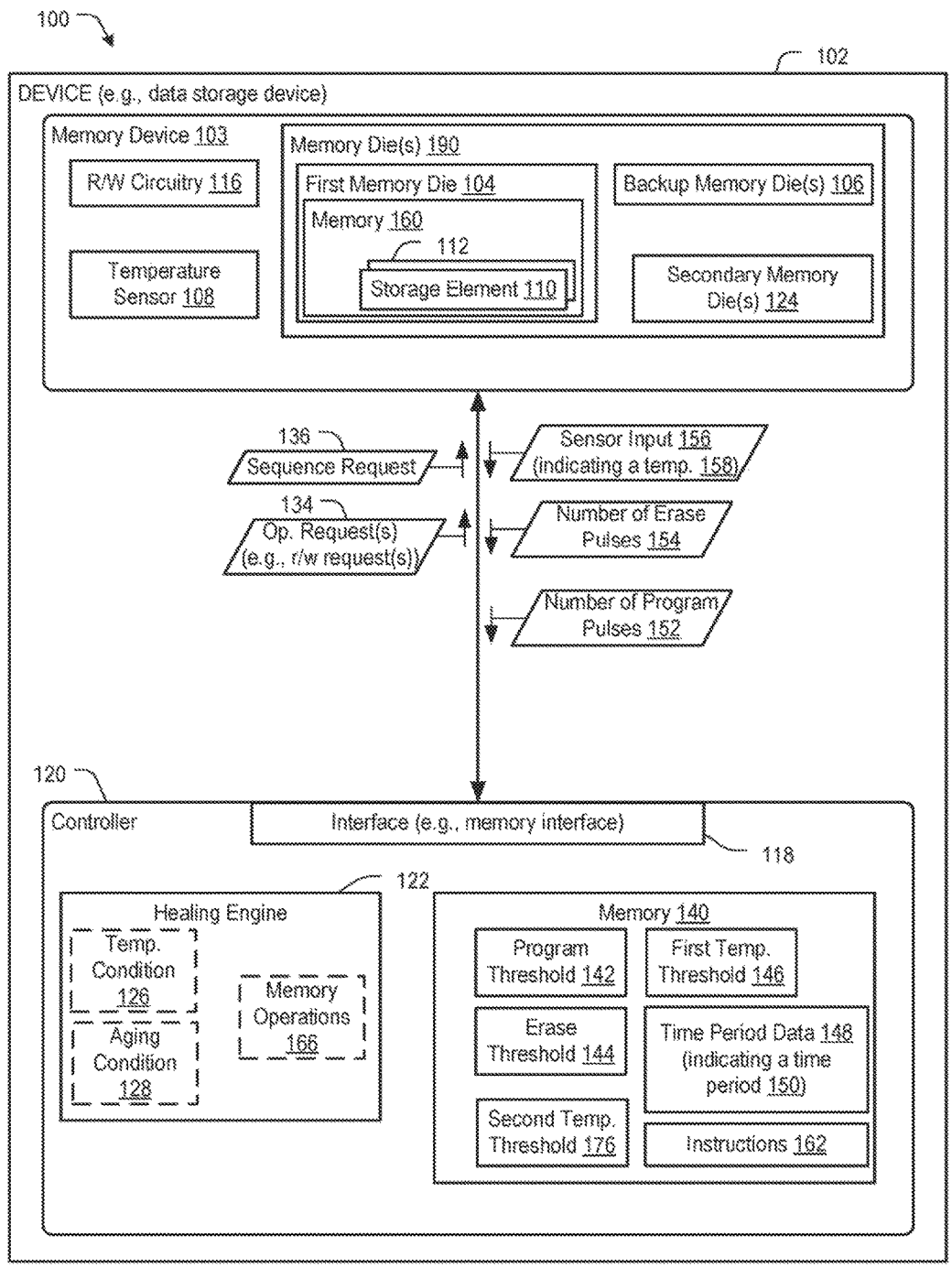
FIG. 1 is a diagram of a particular illustrative example of a system that includes a device, such as a data storage device.

The present disclosure describes systems and methods of controlling memory die temperature based on detecting a characteristic indicative of an aging condition. For example, the aging condition may correspond to an increase in a number of traps (e.g., oxide traps, interface traps, or both) in storage elements of a memory die over time. A high number of traps may increase a number of program pulses to program the storage elements, a number of erase pulses to erase the storage elements, or both. A controller may perform a memory die healing process that includes a temperature adjustment. The temperature adjustment may decrease the number of traps in the storage elements of the memory die. Performing the memory die healing process may limit a loss of storage capacity of the memory die due to a high number of traps in the storage elements. In a particular aspect, a controller may determine that at least one storage element of a first die of a plurality of memory dies of a memory device has a characteristic indicative of an aging condition. For example, the controller may determine that a storage element of the first die has the characteristic in response to determining that a number of program pulses to change a state of the storage element fails to satisfy (e.g., is greater than) a program threshold, that a number of erase pulses to erase the storage element fails to satisfy (e.g., is greater than) an erase threshold, or both.

The controller may, in response to determining that the at least one storage element of the first die has the characteristic indicative of the aging condition, perform a healing process by performing memory operations on the first die. For example, the controller may increase the temperature of the first die by performing the memory operations until detecting a temperature condition related to the temperature of the first die. As an example, detecting the temperature condition may include detecting that the temperature of the first die exceeds a first temperature threshold. As another example, detecting the temperature condition may include detecting expiration of a time period during which the temperature of the first die is maintained above a second temperature threshold. Performing the memory operations may include sending a request to the memory device to initiate a sequence of memory operations. Read/write circuitry of the memory device may be configured to perform a plurality of read operations on the first die in response to receiving the request. As another example, performing the memory operations may include sending a plurality of read requests to the memory device. The read/write circuitry may be configured to perform a read operation on the first die in response to receiving each read request of the plurality of read requests. Each read operation may raise a temperature of the first die.

The controller may determine that the healing process is successful in response to determining that the at least one storage element of the first die no longer has the characteristic indicative of the aging condition. For example, subsequent to performance of the memory operations of the healing process, the number of program pulses to change the state of the storage element of the first die may decrease, the number of erase pulses to erase the storage element may decrease, or both. As a result, the storage element may no longer have the characteristic indicative of the aging condition. For example, the healing process may at least partially reverse the effects of aging on the first die by reducing the number of program pulses to erase the storage element, the number of erase pulses to erase the storage element, or both. To illustrate, the storage element may include a transistor having an insulating oxide layer between a gate and a substrate. During a process of writing to the storage element, electrons may be forced in one direction through the oxide layer. During a process of erasing the storage element, the electrons may be forced in another direction through the oxide layer. The oxide layer may build charge traps due to repetitive electron tunneling from writing and erasing the storage element. The charge traps may cause current degradation in the storage element. For example, the trapped charge may act as a barrier to a flow of current. The charge traps may increase a number of program pulses to change a state of the storage element, the number of erase pulses to erase the storage element, or both. The healing process may reverse the effects of aging by heating the storage element to detrap the trapped electrons from the oxide layer. Performing the healing process on memory dies of the storage device may limit a number of memory dies that are marked as erroneous and may maintain a storage capacity of the storage device over time.

Particular aspects of the disclosure are described below with reference to the drawings. In the description, common or similar features or components may be designated by common reference numbers. As used herein, "exemplary" may indicate an example, an implementation, and/or an aspect, and should not be construed as indicating a preference or a preferred implementation.

Referring to FIG. 1, a particular illustrative example of a system is depicted and generally designated 100. The system 100 includes a device 102. In some implementations, the device 102 corresponds to a data storage device, such as a solid state drive (SSD) data storage device that is configured to be embedded within a device (e.g., a host device, a test device, or an access device) or a removable flash memory data storage device that is configured to be removed from a device (e.g., the host device, the test device, or the access device). In other implementations, the device 102 corresponds to another device, such as an application-specific integrated circuit (ASIC) or a system-on-chip (SoC) device, as illustrative examples.

The device 102 includes a memory device 103. The memory device 103 includes one or more memory dies 190 (e.g., one memory die, two memory dies, sixty-four memory dies, or another number of memory dies). For example, the memory dies 190 may include a first memory die 104, one or more backup memory dies 106, one or more secondary memory dies 124, one or more other memory dies, or a combination thereof. The memory device 103 includes read/write (R/W) circuitry 116 and a temperature sensor 108.

The first memory die 104 includes a memory 160, such as an array of storage elements (e.g., non-volatile storage elements). For example, the array of storage elements may include a first storage element 110, a second storage element 112, one or more other storage elements, or a combination thereof. The memory 160 may include a flash memory (e.g., a NAND flash memory) or a resistive memory, such as a resistive random access memory (ReRAM), as illustrative examples. The memory 160 may have a three-dimensional (3D) memory configuration. As used herein, a 3D memory device may include multiple physical levels of storage elements (instead of having a single physical level of storage elements, as in a planar memory device). As an example, the memory 160 may have a 3D vertical bit line (VBL) configuration. In a particular implementation, the memory 160 is a non-volatile memory having a 3D memory array configuration that is monolithically formed in one or more physical levels of arrays of memory cells having an active area disposed above a silicon substrate. Alternatively, the memory 160 may have another configuration, such as a two-dimensional (2D) memory configuration or a non-monolithic 3D memory configuration (e.g., a stacked die 3D memory configuration).

The device 102 may further include a controller 120 coupled to the memory device 103. In some implementations, the controller 120 corresponds to a semiconductor die that includes components of the controller 120. The controller 120 may include an interface 118 (e.g., a memory interface) to the memory device 103. The controller 120 may include a healing engine 122, memory 140 (e.g., random access memory (RAM)), or both. The healing engine 122 may be implemented by software (e.g., instructions) executable by a processor to perform operations described herein. Alternatively, the healing engine 122 may include hardware configured to perform operations described herein. The healing engine 122 may be configured to heal (e.g., reduce a number of traps in) a memory die (e.g., the first memory die 104) by performing memory operations on the first memory die 104, as described herein. The memory 140 may be configured to store one or more instructions 162. In a particular implementation, the instructions 162, when executed by a processor, enable the processor to perform operations described herein.

The system 100 may correspond to a solid state drive (SSD), such as found in computing devices, such as laptop computers and tablet computers. In some implementations, the system 100, the device 102, the memory device 103, or the memory 160 may be integrated within a network-accessible data storage system, such as an enterprise data system, a network-attached storage (NAS) system, or a cloud data storage system, as illustrative examples.

During operation, the healing engine 122 may determine whether at least one storage element of the first memory die 104 has a characteristic indicative of an aging condition 128. For example, the healing engine 122 may determine that the first storage element 110 has a characteristic indicative of the aging condition 128 based on a number of program pulses 152 to change a state of the first storage element 110, a number of erase pulses 154 to erase the first storage element 110, or both.

In a particular implementation, the R/W circuitry 116 may determine the number of program pulses 152 used to change a state of a particular storage element. For example, the R/W circuitry 116 may perform a read operation to determine that the first storage element 110 has a first state. To illustrate, a threshold voltage of the first storage element 110 may indicate the first state. The first state may indicate an n-bit value when the first storage element 110 stores n bits. For example, the first state may indicate a 1-bit value (e.g., "0") when the first storage element 110 stores 1 bit. Alternatively, the first state may indicate a 3-bit value (e.g., "010") when the first storage element 110 stores 3 bits. The R/W circuitry 116 may apply program pulses to the first storage element 110 to change the state of the first storage element 110 to a second state. For example, the R/W circuitry 116 may write with the program pulses and then perform a read/verify operation to detect that the first storage element 110 has the second state, where the second state indicates a second n-bit value (e.g., "1" or "001"). The R/W circuitry 116 may set the number of program pulses 152 to a default value (e.g., 1) prior to applying the program pulses to the first storage element 110. The R/W circuitry 116 may increment the number of program pulses 152 subsequent to (or prior to) applying each of the program pulses to the first storage element 110. Thus, the number of program pulses 152 indicates how many program pulses are used to change the state of the first storage element 110.

Additionally, or in the alternative, the R/W circuitry 116 may determine the number of erase pulses 154 to erase a particular storage element. For example, the R/W circuitry 116 may perform a read operation to determine that the first storage element 110 has a first state. To illustrate, a threshold voltage of the first storage element 110 may indicate the first state. The R/W circuitry 116 may apply erase pulses to the first storage element 110 change the state the first storage element 110 to an erase state. For example, the R/W circuitry 116 may erase the first storage element 110 with the erase pulses and then perform a read/verify operation to detect that the first storage element 110 is erased. A particular threshold voltage of the first storage element 110 may indicate the erase state. The R/W circuitry 116 may set the number of erase pulses 154 to a default value (e.g., 1) prior to applying the erase pulses to the first storage element 110. The R/W circuitry 116 may increment the number of erase pulses 154 subsequent to (or prior to) applying each of the erase pulses to the first storage element 110. Thus, the number of erase pulses 154 indicates how many erase pulses are used to erase the first storage element 110. The R/W circuitry 116 may send the number of program pulses 152, the number of erase pulses 154, or both, to the controller 120. The controller 120 may receive the number of program pulses 152, the number of erase pulses 154, or both, via the interface 118.

Due to repeated use, a number of traps (e.g., oxide traps, interface traps, or both) in storage elements (e.g., the first storage element 110) may increase over time. A higher number of traps may increase a number of program pulses to program the first storage element 110, a number of erase pulses to erase the first storage element 110, or both. Thus, the number of program pulses 152, the number of erase pulses 154, or both, may indicate an age (or a level of use) of the first memory die 104. The healing engine 122 may determine that the first storage element 110 has a characteristic indicative of the aging condition 128 in response to determining that the number of program pulses 152 is greater than a program threshold 142, that the number of erase pulses 154 is greater than an erase threshold 144, or both. For example, the healing engine 122 may determine that the first storage element 110 has the characteristic indicative of the aging condition 128 in response to determining that the number of program pulses 152 is greater than the program threshold 142, that the number of erase pulses 154 is greater than the erase threshold 144, or both. At least one storage element having the characteristic indicative of the aging condition 128 may indicate that the first memory die 104 has a sufficient number of traps to initiate a healing process.

The healing engine 122 may, in response to determining that the at least one storage element (e.g., the first storage element 110) of the first memory die 104 has the characteristic indicative of the aging condition 128, perform a healing process. The healing process may include performing memory operations 166 (e.g., read operations, write operations, or both) on the first memory die 104 within a relatively short period of time to increase a temperature of the first memory die 104. For example, performing the memory operations 166 may include sending a sequence request 136, via the interface 118, to the memory device 103 to initiate a sequence of memory operations. The sequence of memory operations may include one or more read operations, one or more write operations, or a combination thereof. The sequence of memory operations may be performed on the first storage element 110, another storage element (e.g., the second storage element 112), or both.

The R/W circuitry 116 may be configured to perform the sequence of memory operations on the first memory die 104 in response to receiving the sequence request 136. For example, the sequence request 136 may indicate that at least one storage element (e.g., the first storage element 110) of a memory die (e.g., the first memory die 104) has a characteristic indicative of the aging condition 128. To illustrate, the sequence request 136 may identify the first memory die 104, the first storage element 110, or both. The R/W circuitry 116 may perform the sequence of memory operations on the first memory die 104 in response to determining that the sequence request 136 identifies the first memory die 104. In a particular implementation, the R/W circuitry 116 may perform at least a portion of the sequence of memory operations on the first storage element 110 in response to determining that the sequence request 136 identifies the first storage element 110.

As another example, performing the memory operations 166 may include sending a plurality of operation requests 134, via the interface 118, to the memory device 103. The operation requests 134 may include one or more read requests, one or more write requests, or a combination thereof. The R/W circuitry 116 may be configured to perform a memory operation on the first memory die 104 in response to receiving each operation request of the operation requests 134. For example, the R/W circuitry 116 may be configured to perform a read operation on the first memory die 104 in response to receiving each read request of the one or more read requests. The read operation may be performed on the first storage element 110 or another storage element (e.g., the second storage element 112) of the first memory die 104. As another example, the R/W circuitry 116 may be configured to perform a write operation on the first memory die 104 in response to receiving each write request of the one or more write requests. The write operation may be performed on the first storage element 110 or another storage element (e.g., the second storage element 112) of the first memory die 104.

Execution of each memory operation (e.g., read operation or write operation) raises a temperature of the first memory die 104. Thus, the first memory die 104 can be self-heating by performing multiple memory operations in a relative short period of time. The healing engine 122 may cause the memory operations 166 to be performed until a temperature condition 126 related to a temperature of the first memory die 104 is detected.

The temperature sensor 108 may generate a signal or data based on a temperature of the memory device 103. An output of the temperature sensor 108 may be provided to the controller 120 as sensor input 156. The temperature sensor 108 may be included within the first memory die 104 or located proximate to the first memory die 104. The sensor input 156 indicates a temperature 158 of the memory device 103 at or proximate to the first memory die 104. The controller 120 may receive the sensor input 156 via the interface 118. The healing engine 122 may determine the temperature 158 indicated by the sensor input 156.

In a particular aspect, detecting the temperature condition 126 may include detecting that the temperature 158 exceeds a first temperature threshold 146. For example, the temperature 158 may exceed the first temperature threshold 146 for a relatively short duration (e.g., five minutes). In an alternate aspect, detecting the temperature condition 126 may include detecting expiration of a time period 150 during which the temperature 158 of the first memory die 104 is maintained above a second temperature threshold 176. For example, the temperature 158 may exceed the second temperature threshold 176 for a relatively long duration (e.g., 19 hours-3 weeks). The memory 140 may include time period data 148 indicating the time period 150. The first temperature threshold 146 may be greater than or equal to the second temperature threshold 176. The healing engine 122 may perform a first subset of the memory operations 166 to increase the temperature 158 of the first memory die 104 above the first temperature threshold 146. The healing engine 122 may, subsequent to performing the first subset of the memory operations 166, receive the sensor input 156 at a first time. The sensor input 156 may indicate the temperature 158. The healing engine 122 may determine that the temperature 158 exceeds the first temperature threshold 146. In a particular example, the healing engine 122 may detect the temperature condition 126 in response to determining that the temperature 158 exceeds the first temperature threshold 146.

The temperature of the first memory die 104 may decrease over time due to heat dissipation. The healing engine 122 may receive, at a second time, a second sensor input that indicates a second temperature. The second temperature may be less than the first temperature threshold 146. The healing engine 122 may perform a second subset of the memory operations 166 to bring the temperature of the first memory die 104 above the first temperature threshold 146. For example, the healing engine 122 may, in response to determining that the second temperature is less than the first temperature threshold 146, perform the second subset of the memory operations 166. The healing engine 122 may, subsequent to performing the second subset of the memory operations 166, receive a third sensor input. The third sensor input may indicate a third temperature. The third temperature may exceed the first temperature threshold 146.

Performing a subset of the memory operations 166 may temporarily increase the temperature of the first memory die 104. The temperature of the first memory die 104 may fall subsequent to performance of the subset of the memory operations 166 due to heat dissipation. The temperature of the first memory die 104 may be maintained above the second temperature threshold 176 by performing a second subset of memory operations 166 in response to detecting that the temperature of the first memory die 104 has fallen to within a range (e.g., within 5 degrees) of the second temperature threshold 176. In a particular implementation, the first temperature threshold 146 (e.g., 120 degrees Celsius) may be higher than the second temperature threshold 176 (e.g., 115 degrees Celsius). The difference (e.g., 5 degrees Celsius) between the first temperature threshold 146 and the second temperature threshold 176 may correspond to the range of temperatures (e.g., 115 degrees Celsius-120 degrees Celsius) that trigger a subsequent subset of the memory operations 166. The temperature of the first memory die 104, as measured by the temperature sensor 108, may be approximately equal to the first temperature threshold 146 from the first time to a heating end time. For example, the temperature of the first memory die 104 may vary between a first temperature (e.g., 115 degrees Celsius) and a second temperature (e.g., 125 degrees Celsius) from the first time to the heating end time. The first temperature and the second temperature may be proximate to the first temperature threshold 146. The temperature of the first memory die 104 may exceed the second temperature threshold 176 from the first time to the heating end time. The healing engine 122 may detect the temperature condition 126 in response to expiration of the time period 150. For example, the healing engine 122 may detect the temperature condition 126 in response to determining, at the heating end time, that a difference between the first time and the heating end time is greater than or equal to the time period 150.

Maintaining the temperature of the first memory die 104 above the second temperature threshold 176 during the time period 150 (e.g., by causing multiple memory operations to be performed) may heal the first memory die 104. For example, subsequent to the time period 150, the number of program pulses to change the state of the first storage element 110 may decrease, the number of erase pulses to erase the first storage element 110 may decrease, or both. To illustrate, the R/W circuitry 116 may determine a second number of program pulses to change the state of the first storage element 110, a second number of erase pulses to erase the first storage element 110, or both. The second number of program pulses may be less than the number of program pulses 152. The second number of erase pulses may be less than the number of erase pulses 154. The R/W circuitry 116 may provide the second number of program pulses, the second number of erase pulses, or both, to the controller 120.

The healing engine 122 may determine whether the at least one storage element (e.g., the first storage element 110) of the first memory die 104 has the characteristic indicative of the aging condition 128 based on the second number of program pulses, the second number of erase pulses, or both. The healing engine 122 may, in response to determining that the first storage element 110 continues to have the characteristic indicative of the aging condition 128, perform a subset (e.g., a third subset) of the memory operations 166 until the temperature condition 126 is detected. For example, the healing engine 122 may, in response to determining that the first storage element 110 continues to have the characteristic indicative of the aging condition 128, repeat (one or more times) the process of increasing the temperature of the first memory die 104 until the temperature condition 126 is detected. The healing engine 122 may, alternatively, determine that the healing process is successful in response to determining that the at least one storage element (e.g., the first storage element 110) of the first memory die 104 no longer has the characteristic indicative of the aging condition 128.

In a particular implementation, the healing engine 122 may determine that the healing process is complete in response to determining that the healing process is successful or in response to determining that a healing time period has expired. The healing time period may begin at a begin time that the healing engine 122 starts performing the memory operations 166. The healing engine 122 may determine, at an end time, that the healing time period has expired in response to determining that a difference between the begin time and the end time satisfies (e.g., is greater than or equal to) a healing time threshold. The healing engine 122 may designate the first memory die 104 as erroneous in response to determining that the healing process is not successful and the healing time period has expired. For example, the healing engine 122 may designate the first memory die 104 as erroneous in response to determining that the at least one storage element (e.g., the first storage element 110) of the first memory die 104 continues to have the characteristic indicative of the aging condition 128 after expiration of the healing time period.

In a particular implementation, performing the memory operations 166 on the first memory die 104 may raise a temperature of the secondary memory dies 124. For example, the secondary memory dies 124 may be proximate to the first memory die 104. In this example, the healing engine 122 may identify a particular secondary memory die of the secondary memory dies 124 in response to determining that the particular secondary memory die is within a first memory die distance from the first memory die 104. In a particular aspect, the healing engine 122 may identify the particular secondary memory die in response to determining that the particular secondary memory die is adjacent to the first memory die 104 in a first direction (e.g., a horizontal direction, a vertical direction, or a diagonal direction).

The healing engine 122 may, prior to performing the memory operations 166, copy first data from the first memory die 104, second data from the secondary memory dies 124, or a combination thereof, to the backup memory dies 106. The healing engine 122 may copy the first data from the backup memory dies 106 to the first memory die 104, may copy the second data from the backup memory dies 106 to the secondary memory dies 124, or a combination thereof, subsequent to performing the memory operations 166. The first data may be copied to a first subset of the secondary memory dies 124. The second data may be copied to a second subset of the secondary memory dies 124. The first subset may be distinct from the second subset. In a particular aspect, the first subset may overlap the second subset. The first memory die 104, the secondary memory dies 124, or a combination thereof, may lose data during the healing process. For example, heating storage elements of the first memory die 104, the secondary memory dies 124, or a combination thereof, may cause the storage elements to change state. Copies of the first data, the second data, or both, may be preserved prior to performing the healing process by copying the first data, the second data, or both, to the backup memory dies 106. Subsequent to performing the healing process, the first data, the second data, or both, may be restored from the backup memory dies 106 to the first memory die 104, the secondary memory dies 124, or a combination thereof.

In a particular implementation, the healing process may be performed in the background. For example, during the healing process, the first data, the second data, or both, may be accessed from the backup memory dies 106. Updates to the first data, the second data, or both, may be written to the backup memory dies 106 during the healing process. Subsequent to the healing process, the first data (e.g., the updated first data), the second data (e.g., the updated second data), or both, may be copied from the backup memory dies 106 to the first memory die 104, the secondary memory dies 124, or a combination thereof.

At least one of the program threshold 142, the erase threshold 144, the first temperature threshold 146, or the time period data 148 may include a default value. In a particular implementation, the controller 120 may receive the program threshold 142, the erase threshold 144, the first temperature threshold 146, the time period data 148, or a combination thereof, from another device (e.g., a host device, a test device, or an access device). The program threshold 142, the erase threshold 144, first temperature threshold 146, the time period data 148, or a combination thereof, may be stored in the memory 140.

Advantageously, a number of program pulses to change a state of a storage element of the first memory die 104, a number of erase pulses to erase the storage element of the first memory die 104, or both, may decrease due to the healing process. Thus, the first storage element 110 may not have the characteristic indicative of the aging condition 128 subsequent to performance of the healing process. Performing the healing process on the memory dies 190 of the device 102 may limit a number of memory dies that are marked as erroneous and may maintain a storage capacity of the device 102 over time.

Figure 2:
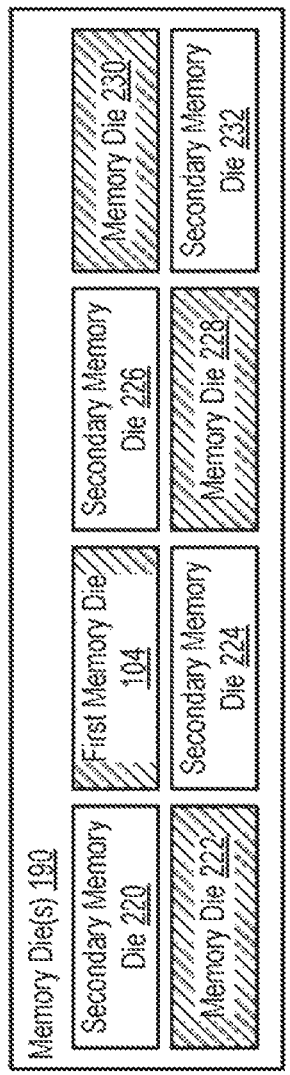
FIG. 2 is a diagram of a particular illustrative example of components that may be included in the device of FIG. 1.

Referring to FIG. 2, illustrative aspects of the memory dies 190 are shown. The memory dies 190 may include the first memory die 104, a secondary memory die 220, a memory die 222, a secondary memory die 224, a secondary memory die 226, a memory die 228, a memory die 230, a secondary memory die 232, or a combination thereof. In a particular aspect, the secondary memory dies 124 may include the secondary memory die 220, the secondary memory die 224, the secondary memory die 226, the secondary memory die 232, or a combination thereof.

The healing engine 122 of FIG. 1 may perform healing processes on the memory dies 190 by performing memory operations on a first subset of dies of the memory dies 190 based on a pattern (e.g., a checkerboard pattern). For example, the memory dies 190 may include the first subset of dies and a second subset of dies. The first subset of dies may include the first memory die 104, the memory die 222, the memory die 228, the memory die 230, or a combination thereof. The second subset of dies may include the secondary memory die 220, the secondary memory die 224, the secondary memory die 226, the secondary memory die 232, or a combination thereof. The first subset of dies and the second subset of dies may be interleaved. For example, the first subset of dies and the second subset of dies may include alternating dies. To illustrate, the first memory die 104 may be positioned between the secondary memory die 220 and the secondary memory die 226.

The healing engine 122 may select the first subset of dies of the memory dies 190 for performing the memory operations 166 of FIG. 1. The healing engine 122 may select the first subset of dies based on the pattern. For example, the healing engine 122 may select alternating dies of the memory dies 190. The healing engine 122 may generate a list indicating the selected dies. The first subset of dies may include the first memory die 104. The healing engine 122 may perform memory operations on the selected dies (e.g., the first subset of dies). For example, the healing engine 122 may maintain a counter indicating a next entry of the list. The healing engine 122 may perform memory operations on a next die corresponding to the next entry and update (e.g., increment by 1) the counter.

Performing memory operations on the first memory die 104 may raise a temperature of one or more secondary dies (e.g., the secondary memory die 220 and the secondary memory die 226) of the second subset of dies that are proximate to the first memory die 104. Raising the temperature of the secondary dies (e.g., the secondary memory die 220 and the secondary memory die 226) may heal the secondary dies. For example, subsequent to performance of the memory operations 166 of FIG. 1 on the first memory die 104, a number of program pulses to change a state of a storage element of the secondary dies (e.g., the secondary memory die 220 and the secondary memory die 226) may decrease, a number of erase pulses to erase the storage element of the secondary dies may decrease, or both. Similarly, subsequent to performance of memory operations 166 on the memory die 228, a number of program pulses to change a state of a storage element of secondary dies (e.g., the secondary memory die 224, the secondary memory die 226, and the secondary memory die 232) may decrease, a number of erase pulses to erase the storage element of the secondary dies may decrease, or both. The healing engine 122 may thus heal each of the memory dies 190 by performing memory operations on fewer than all of the memory dies 190, thereby conserving power.

Figure 3:
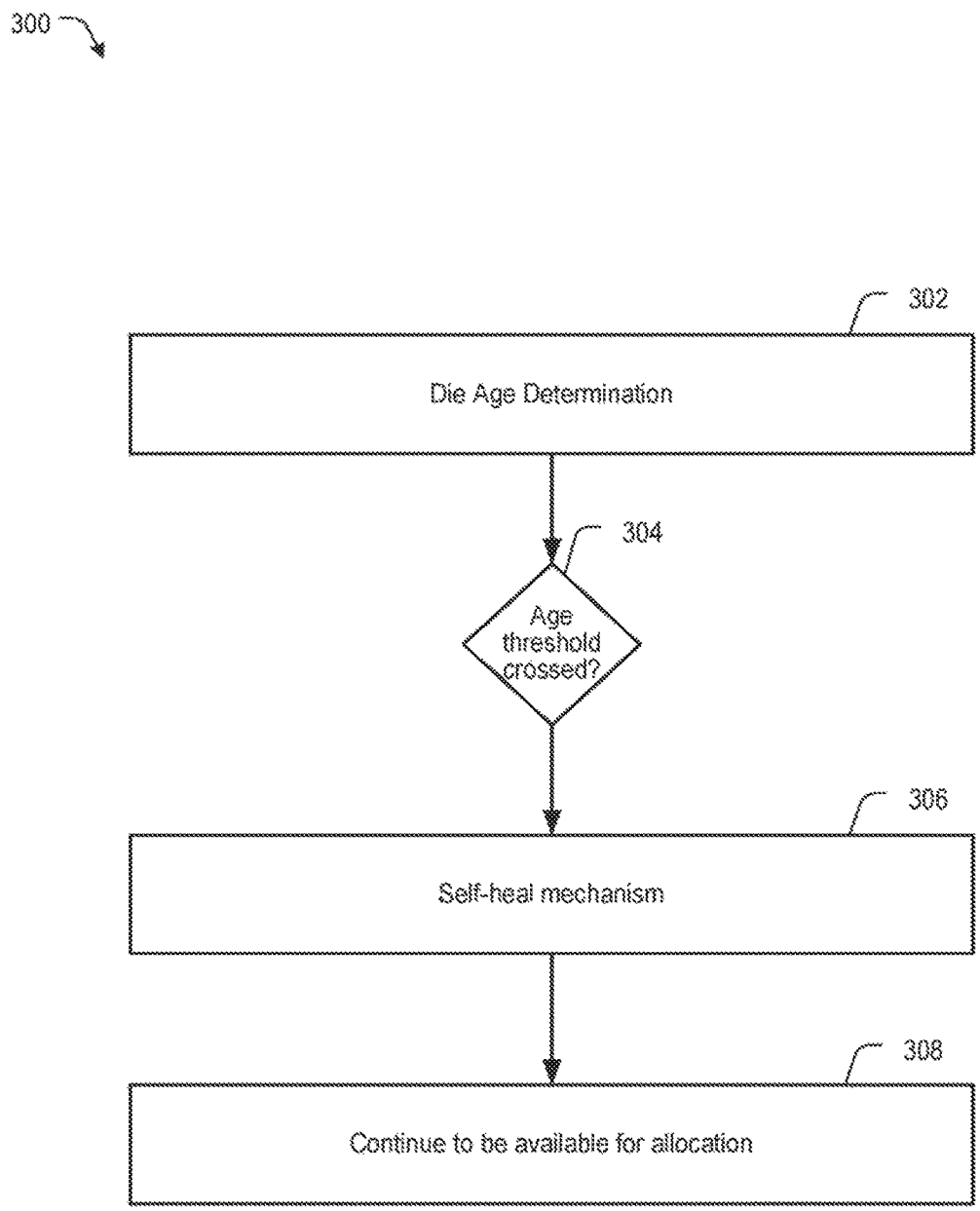
FIG. 3 is a diagram of a particular illustrative example of a method of operation of the device of FIG. 1.

Referring to FIG. 3, an illustrative example of a method is depicted and generally designated 300. The method 300 may be performed by the device 102, the controller 120, R/W circuitry 116, the healing engine 122 of FIG. 1, or a combination thereof.

The method 300 includes die age determination, at 302. For example, the healing engine 122 of FIG. 1 may perform a die age determination of the first memory die 104 by determining the number of erase pulses 154, the number of program pulses 152, or both. For example, the healing engine 122 may receive the number of erase pulses 154, the number of program pulses 152, or both, from the R/W circuitry 116, as described with reference to FIG. 1.

The method 300 also includes determining whether an age threshold is crossed, at 304. For example, the healing engine 122 of FIG. 1 may determine whether the age threshold is crossed by determining whether at least one storage element (e.g., the first storage element 110) of the first memory die 104 has a characteristic indicative of the aging condition 128. To illustrate, the healing engine 122 may determine that the age threshold is crossed in response to determining that the number of erase pulses 154 is greater than the erase threshold 144, that the number of program pulses 152 is greater than the program threshold 142, or both, as described with reference to FIG. 1.

The method 300 further includes initiating a self-healing mechanism, at 306. For example, the healing engine 122 of FIG. 1 may cause a self-healing mechanism (e.g., a healing process) to be performed. The self-healing mechanism may perform the memory operations 166, as described with reference to FIG. 1.

The method 300 also includes continuing to be available for allocation, at 308. For example, the healing engine 122 of FIG. 1 may, subsequent to performing the memory operations 166, determine that the first memory die 104 continues to be available for allocation in response to determining that the healing process is successful, as described with reference to FIG. 1. To illustrate, the healing engine 122 may not mark the first memory die 104 as erroneous in response to determining that, subsequent to performing the healing process, a number of program pulses to change a state of the first storage element 110 is less than or equal to the program threshold 142, a number of erase pulses to erase the first storage element 110 is less than or equal to the erase threshold 144, or both.

The method 300 may limit a number of memory dies of a storage device that are marked as erroneous and may enable a storage capacity of the storage device to be maintained over time.

Figure 4:
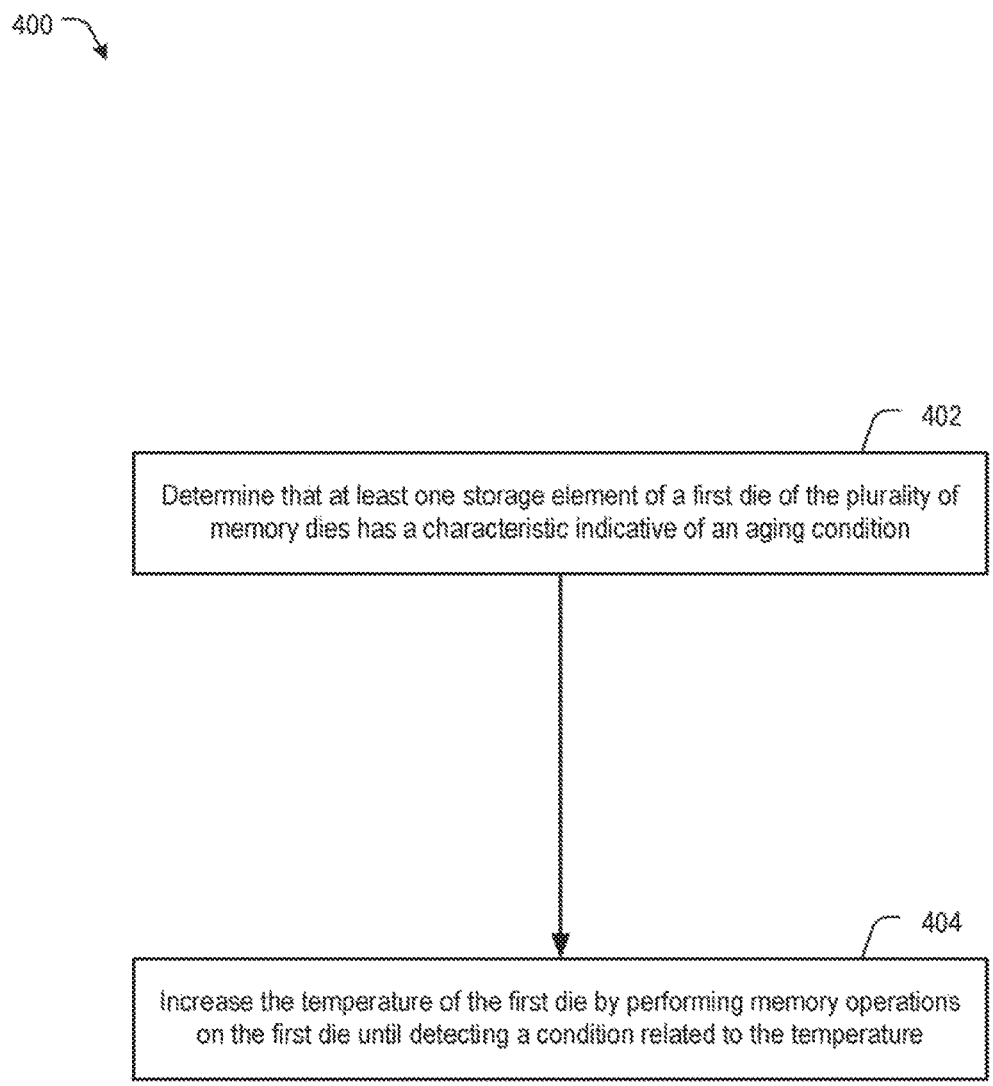
FIG. 4 is a diagram of another particular illustrative example of a method of operation of the device of FIG. 1.

Referring to FIG. 4, an illustrative example of a method is depicted and generally designated 400. The method 400 may be performed by the device 102, the controller 120, the healing engine 122 of FIG. 1, or a combination thereof.

The method 400 includes determining that at least one storage element of a first die of the plurality of memory dies has a characteristic indicative of an aging condition, at 402. For example, the healing engine 122 of FIG. 1 may determine that the first storage element 110 of the first memory die 104 has a characteristic indicative of the aging condition 128, as described with reference to FIG. 1.

The method 400 also includes increasing the temperature of the first die by performing memory operations on the first die until detecting a condition related to the temperature, at 404. For example, the healing engine 122 of FIG. 1 may increase the temperature of the first memory die 104 by performing the memory operations 166 on the first memory die 104 until detecting the temperature condition 126, as described with reference to FIG. 1. The temperature condition 126 is related to the temperature of the first memory die 104.

The method 400 may enable healing of the first memory die 104 by raising the temperature of the first memory die 104 using multiple memory operations. Healing the first memory die 104 may enable the first memory die 104 to be available for allocation and may enable a storage capacity of the device 100 of FIG. 1 to be maintained over time.

Figure 5:
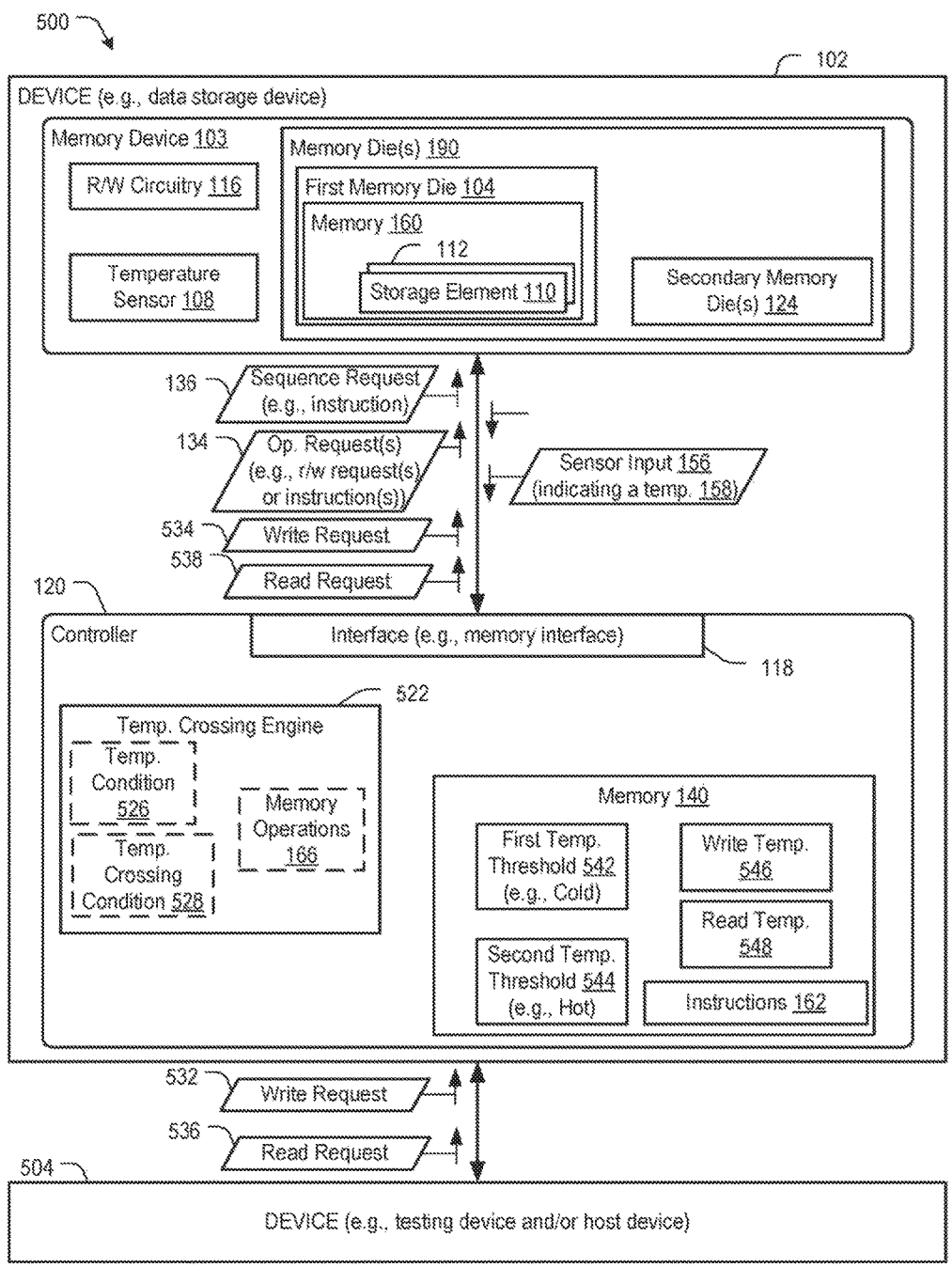
FIG. 5 is a diagram of another illustrative example of a system that includes a device, such as a data storage device.

Referring to FIG. 5, a particular illustrative example of a system is depicted and generally designated 500. The system 500 includes an implementation of the device 102 of FIG. 1 that includes a temperature crossing engine 522. The device 102 may be coupled to, attached to, or embedded within one or more access devices (e.g., a device 504), such as within a housing of the device 504. The device 504 may correspond to a testing device, a host device, or both.

The temperature crossing engine 522 may be implemented by software (e.g., instructions) executable by a processor to perform operations described herein. Alternatively, the temperature crossing engine 522 may include hardware configured to perform operations described herein. The temperature crossing engine 522 may be configured to reduce a bit-error rate associated with reading data by performing memory operations on the memory device 103, as described herein. The memory operations may be performed, prior to a memory access (e.g., a write access or a read access) to heat up a die of the memory device 103. For example, the memory operations may be performed in response to receiving a request to perform the memory access. When a read temperature corresponding to data (e.g., a temperature of the memory die when the data is read from the memory die) is similar to a write temperature corresponding to the data (e.g., a temperature of the memory die when the data is written to the memory die), bit-error rates may be reduced. As used herein, a "temperature crossing" refers to a difference between a read temperature and a write temperature that is likely to cause bit-errors. For example, a temperature crossing may refer to a situation where the read temperature is less than a first threshold and the write temperature is greater than a second threshold. Prior to a memory access, the temperature crossing engine 522 may detect a condition indicative of a temperature crossing, as described herein. For example, the temperature crossing engine 522 may detect the condition in response to receiving a request to perform the memory access. The temperature crossing engine 522 may perform the memory operations 166 to heat up a die of the memory device 103 in response to detecting the condition.

During operation, the temperature crossing engine 522 may determine that a memory access (e.g., a write request 534) is to be performed on the memory device 103. In a particular aspect, the device 102 may receive a write request 532 from the device 504. The temperature crossing engine 522 may determine that the write request 534 is to be performed in response to receiving the write request 532.

The temperature crossing engine 522 may, prior to performing the write request 534, determine whether the memory device 103 has a characteristic indicative of a temperature crossing, as described herein. The write request 534 may correspond to a request to write data at one or more storage elements (e.g., the first storage element 110, the second storage element 112, or both) of the first memory die 104. An output of the temperature sensor 108 may be provided to the controller 120 as the sensor input 156. In a particular aspect, the controller 120 may be configured to detect (e.g., receive) the sensor input 156 in response to determining that the write request 534 is to be performed, in response to receiving the write request 532, or both. The sensor input 156 may indicate a temperature 158 of the memory device 103 at or proximate to the first memory die 104. The temperature crossing engine 522 may determine a write temperature 546 based on the temperature 158 indicated by the sensor input 156. For example, the write temperature 546 may indicate the temperature 158.

The temperature crossing engine 522 may determine, based on the write temperature 546, whether the first memory die 104 has a characteristic indicative of a temperature crossing condition 528, as further described with reference to FIG. 6. For example, the temperature crossing engine 522 may, in response to determining that the write temperature 546 satisfies (e.g., is less than) a first temperature (temp.) threshold 542, determine that the first memory die 104 has the characteristic indicative of the temperature crossing condition 528. As another example, the temperature crossing engine 522 may, in response to determining that the write temperature 546 fails to satisfy (e.g., is greater than or equal to) the first temperature threshold 542, determine that the first memory die 104 does not have the characteristic indicative of the temperature crossing condition 528.

The temperature crossing engine 522 may, in response to determining that the first memory die 104 does not have the characteristic indicative of the temperature crossing condition 528, determine that the memory device 103 does not have the characteristic indicative of a temperature crossing. The temperature crossing engine 522 may perform the write request 534 in response to determining that the memory device 103 does not have the characteristic indicative of a temperature crossing. For example, the temperature crossing engine 522 may provide data to the R/W circuitry 116. The R/W circuitry 116 may write the data to the first storage element 110, the second storage element 112, or both, of the first memory die 104.

Alternatively, the temperature crossing engine 522 may, in response to determining that the first memory die 104 has the characteristic indicative of the temperature crossing condition 528, determine that the memory device 103 has the characteristic indicative of a temperature crossing. The temperature crossing engine 522 may, in response to determining that the memory device 103 has the characteristic indicative of a temperature crossing, increase a temperature of the memory device 103 (e.g., the first memory die 104) by performing the memory operations 166 (e.g., read operations, write operations, or both) on the first memory die 104 within a relatively short period of time, as described with reference to FIG. 1.

Performing the memory operations 166 may include sending an instruction (e.g., the sequence request 136), via the interface 118, to the memory device 103 to initiate a sequence of memory operations, as described with reference to FIG. 1. The sequence of memory operations may be performed on the first storage element 110, another storage element (e.g., the second storage element 112), or both.

The R/W circuitry 116 may be configured to perform the sequence of memory operations on the first memory die 104 in response to receiving the sequence request 136, as described with reference to FIG. 1. For example, the sequence request 136 may indicate that at least one storage element (e.g., the first storage element 110) of a memory die (e.g., the first memory die 104) has a characteristic indicative of the temperature crossing condition 528. To illustrate, the sequence request 136 may include an instruction that identifies the first memory die 104, the first storage element 110, or both. The R/W circuitry 116 may perform the sequence of memory operations on the first memory die 104 in response to determining that the sequence request 136 identifies the first memory die 104. In a particular implementation, the R/W circuitry 116 may perform at least a portion of the sequence of memory operations on the first storage element 110 in response to determining that the sequence request 136 identifies the first storage element 110.

As another example, performing the memory operations 166 may include sending a plurality of instructions (e.g., the plurality of operation requests 134), via the interface 118, to the memory device 103, as described with reference to FIG. 1. The R/W circuitry 116 may be configured to perform a memory operation (e.g., a read operation or a write operation) on the first memory die 104 in response to receiving each operation request (e.g., instruction) of the operation requests 134. The memory operation may be performed on the first storage element 110 or another storage element (e.g., the second storage element 112) of the first memory die 104.

Execution of each memory operation (e.g., read operation or write operation) raises a temperature of the first memory die 104, as described with reference to FIG. 1. The temperature crossing engine 522 may cause the memory operations 166 to be performed until a temperature condition 526 related to a temperature of the first memory die 104 is detected.

The controller 120 may, subsequent to performance of at least a subset of the memory operations 166, receive the sensor input 156 indicating the temperature 158 at or proximate to the first memory die 104. In a particular aspect, detecting the temperature condition 526 may include detecting that the temperature 158 is greater than or equal to a first temperature (temp.) threshold 542. The temperature crossing engine 522 may, in response to determining that the temperature 158 is less than the first temperature threshold 542, perform another subset of the memory operations 166. The controller 120 may perform the write request 534 in response to detecting the temperature condition 526. For example, detecting the temperature condition 526 may include receiving the sensor input 156 indicating the temperature 158 and determining that the temperature 158 satisfies (e.g., is greater than) the first temperature threshold 542.

In a particular implementation, the write temperature 546 may represent a temperature corresponding to the first memory die 104 prior to performing the write request 534. A temperature at which data is written to the first memory die 104 may be greater than the write temperature 546 when the memory operations 166 are performed subsequent to determining the write temperature 546 and prior to performing the write request 534. In an alternate implementation, the temperature crossing engine 522 may update the write temperature 546 subsequent to performing the memory operations 166. For example, the temperature crossing engine 522 may update the write temperature 546 to indicate the temperature 158 in response to determining that the temperature 158 satisfies (e.g., is greater than) the first temperature threshold 542.

The temperature crossing engine 522 may store the write temperature 546 in the memory 140 of the controller 120. In a particular aspect, the temperature crossing engine 522 may store the write temperature 546 in the memory 140 in response to determining that the write temperature 546 satisfies (e.g., is greater than) a second temperature threshold 544. The temperature crossing engine 522 may refrain from storing the write temperature 546 in the memory 140 in response to determining that the write temperature 546 fails to satisfy (e.g., is less than or equal to) the second temperature threshold 544. The write temperature 546 may be associated with the data stored at the first storage element 110, the second storage element 112, or both. For example, the write temperature 546 may be associated with a memory address of the data. To illustrate, the write temperature 546 may be stored in the memory 140 with a reference (e.g., the memory address) to a memory location of the data.

In a particular aspect, the temperature crossing engine 522 may determine that a read request 538 is to be performed on the memory device 103. For example, the device 102 may, in response to receiving a read request 536 from the device 504, determine that the read request 538 (e.g., a memory access) is to be performed.

The temperature crossing engine 522 may, prior to performing the read request 538, determine whether the memory device 103 has a characteristic indicative of a temperature crossing, as described herein. For example, the temperature crossing engine 522 may, in response to receiving the read request 536, determine whether the memory device 103 has a characteristic indicative of a temperature crossing. The read request 538 may correspond to a request to read data stored at one or more storage elements (e.g., the first storage element 110, the second storage element 112, or both) of the first memory die 104. The controller 120 may receive the sensor input 156 indicating the temperature 158 of the memory device 103 at or proximate to the first memory die 104. For example, the controller 120 may receive the sensor input 156 subsequent to determining that the read request 538 is to be performed. In a particular aspect, the controller 120 may be configured to detect (e.g., receive) the sensor input 156 in response to determining that the read request 538 is to be performed, in response to receiving the read request 536, or both. The temperature crossing engine 522 may determine a read temperature 548 based on the temperature 158 indicated by the sensor input 156. For example, the read temperature 548 may indicate the temperature 158.

The temperature crossing engine 522 may determine, based on the read temperature 548, the write temperature 546, or both, whether the first memory die 104 has a characteristic indicative of the temperature crossing condition 528, as further described with reference to FIG. 7. The temperature crossing engine 522 may, in response to determining that the first memory die 104 does not have the characteristic indicative of the temperature crossing condition 528, determine that the memory device 103 does not have the characteristic indicative of a temperature crossing. The temperature crossing engine 522 may perform the read request 538 in response to determining that the memory device 103 does not have the characteristic indicative of a temperature crossing. For example, the controller 120 may send the read request 538 to the R/W circuitry 116. The R/W circuitry 116 may read data from the first storage element 110, the second storage element 112, or both, of the first memory die 104. The R/W circuitry 116 may provide the data to the controller 120, and the controller 120 may provide the data to the device 504.

Alternatively, the temperature crossing engine 522 may, in response to determining that the first memory die 104 has the characteristic indicative of the temperature crossing condition 528, determine that the memory device 103 has the characteristic indicative of a temperature crossing. The temperature crossing engine 522 may, in response to determining that the memory device 103 has the characteristic indicative of a temperature crossing, increase a temperature of the memory device 103 (e.g., the first memory die 104) by performing the memory operations 166 on the first memory die 104 within a relatively short period of time, as described herein. The temperature crossing engine 522 may cause the memory operations 166 to be performed until a temperature condition 526 related to a temperature of the first memory die 104 is detected.

The controller 120 may, subsequent to performance of at least a subset of the memory operations 166, receive the sensor input 156 indicating the temperature 158 at or proximate to the first memory die 104. In a particular aspect, detecting the temperature condition 526 may include detecting that the temperature 158 is greater than or equal to the first temperature threshold 542 (or the second temperature threshold 544), as further described with reference to FIG. 7. The temperature crossing engine 522 may, in response to determining that the temperature 158 is less than the first temperature threshold 542 (or the second temperature threshold 544), perform another subset of the memory operations 166. The temperature crossing engine 522 may perform the read request 538 in response to detecting the temperature condition 526.

The read temperature 548 may thus represent a temperature corresponding to the first memory die 104 prior to performing the read request 538. A temperature at which data is read from the first memory die 104 may be greater than the read temperature 548 when the memory operations 166 are performed subsequent to determining the read temperature 548 and prior to performing the read request 538.

In a particular implementation, performing the memory operations 166 on the first memory die 104 may raise a temperature of the secondary memory dies 124, as described with reference to FIG. 1. The temperature crossing engine 522 may perform subsequent writes on one or more of the secondary memory dies 124. For example, the controller 120 may receive a second request from the device 504 to perform a write access at the memory device 103. The controller 120 may, in response to receiving the second request, perform the write access at a second die of the secondary memory dies 124 subsequent to performing the memory operations 166 on the first memory die 104. In a particular aspect, the second die may be heated by the memory operations 166 performed on the first memory die 104 and the temperature crossing engine 522 may perform fewer (e.g., no) memory operations prior to performing the write access on the second die. For example, a write temperature of the second die may be closer to the first temperature threshold 542 subsequent to performance of the memory operations 166 on the first memory die 104 and fewer memory operations may be used to raise the temperature of the second die to at least the first temperature threshold 542. In a particular aspect, the write temperature of the second die may be greater than or equal to the first temperature threshold 542 subsequent to performance of the memory operations 166 on the first memory die 104 and the write access to the second die may be performed without prior performance of memory operations to increase the temperature of the second die.

In a particular aspect, the temperature crossing engine 522 may perform the memory operations 166 on a second memory die of the secondary memory dies 124 to raise a temperature of the first memory die 104. For example, the temperature crossing engine 522 may, in response to determining that the request (e.g., the write request 532 or the read request 536) corresponds to the first memory die 104, identify a second memory die of the second memory dies 124. The temperature crossing engine 522 may perform the memory operations 166 on the second memory die to increase a temperature of the first memory die 104. For example, the memory operations 166 may be performed on the second memory die to raise the temperature of the first memory die 104 in response to determining that temperatures of multiple memory dies including the first memory die 104 are to be raised. To illustrate, the second memory die may correspond to the secondary memory die 224 of FIG. 2 and the temperature crossing engine 522 may determine that temperatures of the first memory die 104, the memory die 222, and the memory 228 of FIG. 2 are to be raised, as described herein.

Performing the memory operations 166 on the secondary memory die 224 to raise the temperature of the multiple memory dies (e.g., the first memory die 104, the memory die 222, and the memory die 228) may result in fewer memory operations being performed than performing memory operations on each of the multiple memory dies (e.g., the first memory die 104, the memory die 222, and the memory die 228). For example, performing memory operations on the first memory die 104 may not increase a temperature of the memory die 222 or the memory die 228 as much as performing the memory operations 166 on the secondary memory die 224 because the memory die 222 and the memory die 228 are closer to the secondary memory die 224 than to the first memory die 104. Performing the memory operations on the first memory die 104 to raise a temperature of the first memory die 104 to at least the first temperature threshold 542 may result in additional memory operations being performed on the memory die 222 and on the memory die 228 to raise the temperatures of the memory die 222 and the memory die 228 to at least the first temperature threshold 542. For example, a first number of memory operations may be performed to raise a temperature of the first memory die 104 to at least the first temperature threshold 542, a second number of memory operations may be performed to raise a temperature of the memory die 222 to at least the first temperature threshold 542, and a third number of memory operations may be performed to raise a temperature of the memory die 228 to at least the first temperature threshold 542. A sum of the first number, the second number, and the third number may be greater than a count of the memory operations 166 performed on the secondary memory die 224 to raise the temperature of each of the first memory die 104, the memory die 222, and the memory die 228 to at least the first temperature threshold 542. The temperature crossing engine 522 may thus reduce a number of memory operations performed to heat multiple dies.

As described above, in some implementations, the controller 120 delays writing data to the memory device 103 until the temperature of the first memory die 104 meets the temperature condition 526 (e.g., is greater than the first temperature threshold 542). In other implementations, where the first memory die 104 includes multi-level cell (MLC) and single-level cell (SLC) storage elements, the memory controller 120 may write the data to the SLC storage elements prior to heating up the first memory die 104. Writing the data to the SLC storage elements prior to performing the memory operations 166 may reduce a latency associated with the write request 534 because the controller 120 may signal to the device 504 that the data is stored upon writing to the SLC storage elements. After the temperature of the first memory die 104 satisfies (e.g., is greater than) the first temperature threshold 542, the controller 120 may copy or 'fold' data from the SLC storage elements to the MLC storage elements. For example, the first storage element 110 may, according to an MLC scheme, indicate multiple (e.g., three) values. In a particular implementation, the temperature crossing engine 522 may, in response to determining that the memory device 103 has the characteristic indicative of a temperature crossing, write data of the write request 534 to one or more SLC storage elements of the memory device 103. Each of the one or more SLC storage elements may, according to a SLC scheme, indicate a single value. A portion of the first memory die 104 may include the one or more SLC storage elements. The temperature crossing engine 522 may, in response to detecting the temperature condition 526, copy the data from the one or more SLC storage elements to MLC storage elements (e.g., the first storage element 110).

At least one of the first temperature threshold 542 or the second temperature threshold 544 may include a default value. In a particular implementation, the controller 120 may receive the first temperature threshold 542, the second temperature threshold 544, or both, from the device 504 (e.g., a host device, a test device, or an access device). The first temperature threshold 542, the second temperature threshold 544, or both, may be stored in the memory 140.

Advantageously, the temperature crossing engine 522 may, prior to performing a memory access, raise a temperature of the first memory die 104 to increase a likelihood that a write temperature of data that is written to the first memory die 104 is substantially similar to a temperature at which data is read from the first memory die 104, as further described with reference to FIGS. 6-7. When the write temperature is substantially similar to the read temperature, a number of bit errors associated with data reads at the memory device 103 may be reduced.

Referring to FIG. 6, a diagram 600 includes a particular illustrative example of conditions that may be detected by the device 102, the controller 120 of FIG. 1, the temperature crossing engine 522, the system 500 of FIG. 5, or a combination thereof.

The temperature crossing engine 522 may, in response to determining that the write request 534 is to be performed, determine whether the first memory die 104 has a characteristic indicative of the temperature crossing condition 528 based on the write temperature 546. The diagram 600 illustrates a first case 602, a second case 604, and a third case 606. It should be understood that the first case 602, the second case 604, and the third case 606 are provided as illustrative, non-limiting examples. In some implementations, the temperature crossing engine 522 may use other cases to determine whether the first memory die 104 has a characteristic indicative of the temperature crossing condition 528.

In the first case 602, the temperature crossing engine 522 may, in response to determining that the write temperature 546 is less than the first temperature threshold 542, determine that the first memory die 104 has the characteristic indicative of the temperature crossing condition 528. The temperature crossing engine 522 may perform the memory operations 166 until detecting that the temperature 158 at or proximate to the first memory die 104 is greater than or equal to the first temperature threshold 542, as described with reference to FIG. 5. The temperature crossing engine 522 may perform the write request 534 subsequent to detecting that the temperature 158 is greater than or equal to the first temperature threshold 542.

In the second case 604, the temperature crossing engine 522 may, in response to determining that the write temperature 546 is greater than or equal to the first temperature threshold 542 and less than or equal to the second temperature threshold 544, determine that the first memory die 104 does not have the characteristic indicative of the temperature crossing condition 528. The temperature crossing engine 522 may perform the write request 534 in response to detecting that the first memory die 104 does not have the characteristic indicative of the temperature crossing condition 528.

In the third case 606, the temperature crossing engine 522 may, in response to determining that the write temperature 546 is greater than the second temperature threshold 544, determine that the first memory die 104 does not have the characteristic indicative of the temperature crossing condition 528. The temperature crossing engine 522 may perform the write request 534 and, in response to determining that the write temperature 546 is greater than the second temperature threshold 544, store the write temperature 546 in the memory 140.

Figure 7:
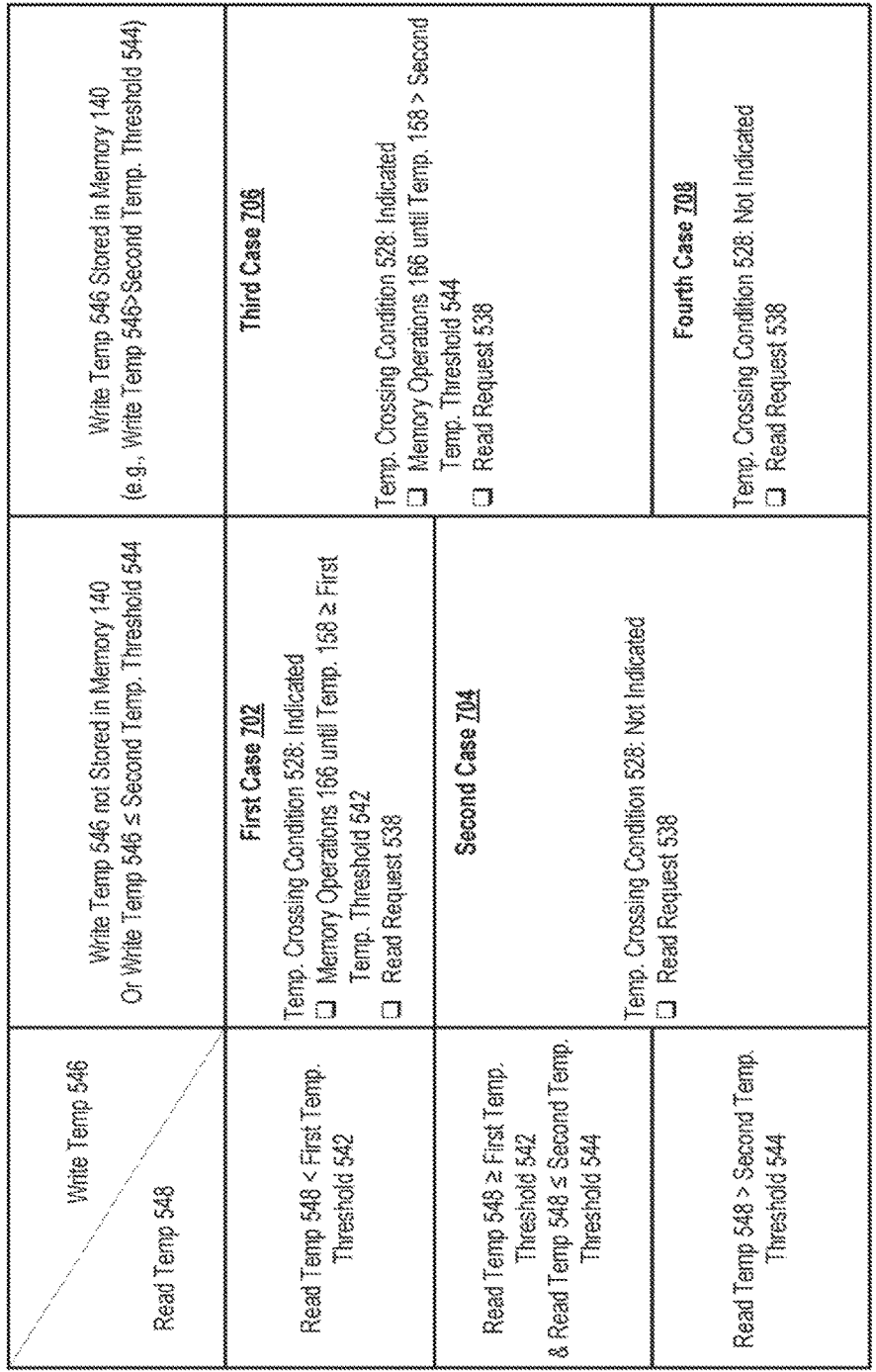
FIG. 7 is a diagram of another illustrative example of conditions detected by the device of FIG. 5.

Referring to FIG. 7, a diagram 700 includes a particular illustrative example of conditions that may be detected by the device 102, the controller 120 of FIG. 1, the temperature crossing engine 522, the system 500 of FIG. 5, or a combination thereof.

The temperature crossing engine 522 may, in response to determining that the read request 538 is to be performed, determine whether the first memory die 104 has a characteristic indicative of the temperature crossing condition 528 based on the write temperature 546, the read temperature 548, or both. The diagram 700 includes a first case 702, a second case 704, a third case 706, and a fourth case 708.

The temperature crossing engine 522 may perform the memory operations 166 on the memory device 103 to heat the memory device 103 to at least the first temperature threshold 542 prior to performing the write request 534, as described with reference to FIG. 6. The temperature crossing engine 522 may perform the memory operations 166 on the memory device 103 to heat the memory device 103 to a second temperature (e.g., greater than or equal to the first temperature threshold 542 or greater than the second temperature threshold 544) prior to performing the read request 538, as described herein. The second temperature may be based on the write temperature 546. The temperature crossing engine 522 may, in response to determining that the read temperature 548 fails to satisfy (e.g., is less than) the first temperature threshold 542, perform the memory operations 166 to heat the memory device 103 to a temperature that satisfies (e.g., is greater than) the first temperature threshold 542. In a particular aspect, the temperature crossing engine 522 may, in response to determining that the read temperature 548 fails to satisfy (e.g., is less than or equal to) the second temperature threshold 544 and that the write temperature 546 satisfies (e.g., is greater than) the second temperature threshold 544, perform the memory operations 166 to heat the memory device 103 to a temperature that satisfies (e.g., is greater than) the second temperature threshold 544.

In the first case 702, the temperature crossing engine 522 may, in response to determining that the read temperature 548 is less than the first temperature threshold 542 and that the write temperature 546 is either not stored in the memory 140 or is less than or equal to the second temperature threshold 544, determine that the first memory die 104 has the characteristic indicative of the temperature crossing condition 528. The temperature crossing engine 522 may perform the memory operations 166 until detecting that the temperature 158 at or proximate to the first memory die 104 is greater than or equal to the first temperature threshold 542, as described with reference to FIG. 5. The temperature crossing engine 522 may perform the read request 538 subsequent to detecting that the temperature 158 is greater than or equal to the first temperature threshold 542.

In the second case 704, the temperature crossing engine 522 may, in response to determining that the write temperature 546 is not stored in the memory 140 or that the write temperature 546 is less than or equal to the second temperature threshold 544, and that the read temperature 548 is greater than or equal to the first temperature threshold 542, determine that the first memory die 104 does not have the characteristic indicative of the temperature crossing condition 528. The temperature crossing condition 528 may correspond to a condition where performing the memory operations 166 may reduce bit-errors caused by a temperature crossing. In a particular aspect, a temperature (e.g., warm) of the first memory die 104 when the write request 534 is performed may be substantially the same as the read temperature 548 (e.g., warm) and the temperature crossing engine 522 may determine that the first memory die 104 does not indicate a characteristic indicative of a temperature crossing and thus does not have the characteristic indicative of the temperature crossing condition 528. In another aspect, the read temperature 548 (e.g., hot) may be greater than the temperature (e.g., warm) of the first memory die 104 when the write request 534 was performed. Performing the memory operations 166 prior to performing the read request 538 may raise the temperature of the first memory die 104 thereby causing more bit-errors by increasing a difference between the temperature (e.g., warm) of the first memory die 104 when the write request 534 was performed and a temperature (e.g., hotter) of the first memory die 104 when the read request 538 is performed. The temperature crossing engine 522 may determine that the first memory die 104 indicates a characteristic indicative of a temperature crossing. The temperature crossing engine 522 may, in response to determining that performing the memory operations 166 will not reduce bit-errors, determine that the first memory die 104 does not have the characteristic indicative of the temperature crossing condition 528. The temperature crossing engine 522 may perform the read request 538 without using the memory operations 166 to heat the first memory die 104.

In the third case 706, the temperature crossing engine 522 may, in response to determining that the write temperature 546 is stored in the memory 140, that the write temperature 546 is greater than the second temperature threshold 544, or both, and that the read temperature 548 is less than or equal to the second temperature threshold 544, determine that the first memory die 104 has the characteristic indicative of the temperature crossing condition 528. The temperature crossing engine 522 may perform the memory operations 166 until detecting that the temperature 158 at or proximate to the first memory die 104 is greater than the second temperature threshold 544, as described with reference to FIG. 5. The temperature crossing engine 522 may perform the read request 538 subsequent to detecting that the temperature 158 is greater than the second temperature threshold 544.

In the fourth case 708, the temperature crossing engine 522 may, in response to determining that the write temperature 546 is stored in the memory 140, that the write temperature 546 is greater than the second temperature threshold 544, or both, and that the read temperature 548 is greater than the second temperature threshold 544, determine that the first memory die 104 does not have the characteristic indicative of the temperature crossing condition 528. The temperature crossing engine 522 may perform the read request 538 in response to detecting that the first memory die 104 does not have the characteristic indicative of the temperature crossing condition 528. The temperature crossing engine 522 may perform the read request 538 without using the memory operations 166 to heat the first memory die 104.

In the first case 702, the temperature crossing engine 522 may reduce a bit-error rate associated with data reads at the memory device 103 by performing the memory operations 166 prior to performing the read request 538. In the first case 702, the write temperature 546 and the read temperature 548 may both be less than the first temperature threshold 542 (e.g., cold). The temperature crossing engine 522 may perform the memory operations 166 prior to performing the write request 534 and also prior to performing the read request 538 such that a temperature (e.g., warm) of the first memory die 104 when the read request 538 is performed is substantially similar to a temperature (e.g., warm) of the first memory die 104 when the write request 534 is performed.

Alternatively, in the first case 702, the write temperature 546 (e.g., warm) may be greater than or equal to the first temperature threshold 542 and less than or equal to the second temperature threshold 544. The temperature crossing engine 522 may refrain from performing the memory operations 166 prior to performing the write request 534. The read temperature 548 (e.g., cold) may be less than the first temperature threshold 542. The temperature crossing engine 522 may perform the memory operations 166 prior to performing the read request 538 such that a temperature (e.g., warm) of the first memory die 104 when the read request 538 is performed is substantially similar to a temperature (e.g., warm) of the first memory die 104 when the write request 534 is performed.

In the second case 704, in a particular aspect, the read temperature 548 (e.g., warm) may be substantially similar to a temperature of the first memory die 104 when the write request 534 is performed and the temperature crossing engine 522 may refrain from performing the memory operations 166 prior to performing the read request 538. For example, the write temperature 546 (e.g., warm) may be greater than or equal to the first temperature threshold 542 and less than or equal to the second temperature threshold 544. The temperature crossing engine 522 may, in response to determining that the write temperature 546 (e.g., warm) is greater than or equal to the first temperature threshold 542 and less than or equal to the second temperature threshold 544, determine that the first memory die 104 does not have a characteristic indicative of the temperature crossing condition 528. The temperature crossing engine 522 may, in response to determining that the first memory die 104 does not have a characteristic indicative of the temperature crossing condition 528, refrain from performing the memory operations 166 prior to performing the write request 534.

The read temperature 548 may be unknown at the time of performing the write request 534. A first likelihood that the read temperature 548 is less than or equal to the second temperature threshold 544 may be higher than a second likelihood that the read temperature 548 is greater than the second temperature threshold 544. When the first likelihood is greater than the second likelihood, refraining from performing the memory operations 166 in response to determining that the write temperature 546 (e.g., warm) is greater than or equal to the first temperature threshold 542 and less than or equal to the second temperature threshold 544 may reduce an overall number of memory operations performed. For example, refraining from performing the memory operations 166 to raise a temperature of the first memory die 104 above the second temperature threshold 544 prior to performing the write request 534 may result in fewer memory operations being performed to raise a temperature of the first memory die 104 to at least the first temperature threshold 542 when the read temperature 548 is less than the first temperature threshold 542. As another example, when the read temperature 548 is greater than or equal to the first temperature threshold 542 and less than or equal to the second temperature threshold 544, refraining from performing the memory operations 166 to raise a temperature of the first memory die 104 above the second temperature threshold 544 prior to performing the write request 534 may result in no memory operations being performed prior to performing the read request 538. When the read temperature 548 has a greater likelihood of being less than or equal to the second temperature threshold 544, refraining from performing the memory operations 166 to raise a temperature of the first memory die 104 above the second temperature threshold 544 prior to performing the write request 534 may result in fewer memory operations being performed prior to performing the read request 538.

As another example, the write temperature 546 (e.g., cold) may be less than the first temperature threshold 542 and the temperature crossing engine 522 may perform the memory operations 166 prior to performing the write request 534. The read temperature 548 (e.g., warm) may be greater than or equal to the first temperature threshold 542 and less than or equal to the second temperature threshold 544. Performing the memory operations 166 prior to performing the write request 534 may cause a temperature of the first memory die 104 when the write request 534 is performed to be substantially the same as the read temperature 548. A temperature (e.g., warm) of the first memory die 104 when the read request 538 is performed may be substantially similar to a temperature (e.g., warm) of the first memory die 104 when the write request 534 is performed. Performing the memory operations 166 prior to performing the write request 534 may result in the first memory die 104 not having a characteristic indicative of a temperature crossing prior to performing the read request 538. Bit-errors associated with a temperature crossing may thus be reduced (e.g., eliminated).

In the second case 704, in an alternate aspect, the read temperature 548 (e.g., hot) may be higher than a temperature of the first memory die 104 when the write request 534 is performed. The write temperature 546 (e.g., cold) may be less than the first temperature threshold 542 and the temperature crossing engine 522 may perform the memory operations 166 prior to performing the write request 534, thereby at least reducing the difference between the temperature (e.g., warm) at which the write request 534 is performed and the temperature (e.g., hot) at which the read request 538 is performed. A temperature crossing corresponding to a lower difference between the temperature (e.g., warm) at which the write request 534 is performed and the temperature (e.g., hot) at which the read request 538 is performed may result in fewer bit-errors than a temperature crossing corresponding to a higher difference between the temperature (e.g., cold) at which the write request 534 is performed and the temperature (e.g., hot) at which the read request 538 is performed. Performing the memory operations 166 prior to performing the write request 534 may thus reduce bit-errors associated with a temperature crossing.

Alternatively, the write temperature 546 (e.g., warm) may be greater than or equal to the first temperature threshold 542 and less than or equal to the second temperature threshold 544. The temperature crossing engine 522 may refrain from performing the memory operations 166 prior to performing the write request 534 because the read temperature 548 (e.g., hot) is unknown at the time of performing the write request 534. For example, the temperature crossing engine 522 may refrain from performing the memory operations 166 prior to performing the write request 534 to reduce a number of overall memory operations when a first likelihood that the read temperature 548 is less than or equal to the second temperature threshold 544 is greater than a second likelihood that the read temperature 548 is greater than the second temperature threshold 544. The temperature crossing engine 522 may refrain from performing the memory operations 166 prior to performing the read request 538 because raising the temperature of the first memory die 104 would further increase a difference between a temperature (e.g., warm) at which the write request 534 was performed and a temperature (e.g., hot) at which the read request 538 is performed.

In the third case 706, the temperature crossing engine 522 may reduce a bit-error rate associated with data reads at the memory device 103 by performing the memory operations 166 prior to performing the read request 538. In the third case 706, the write temperature 546 (e.g., hot) may be greater than the second temperature threshold 544 and the read temperature 548 (e.g., cold or warm) may be less than the second temperature threshold 544. The temperature crossing engine 522 may perform the memory operations 166 prior to performing the read request 538 such that a temperature (e.g., hot) of the first memory die 104 when the read request 538 is performed is substantially similar to a temperature (e.g., hot) of the first memory die 104 when the write request 534 is performed. As a result of performing the memory operations 166 prior to performing the read request 538, the first memory die 104 may not have a characteristic indicative of a temperature crossing. Bit-errors associated with a temperature crossing may thus be reduced (e.g., eliminated).

In the fourth case 708, the read temperature 548 may be substantially similar to a temperature of the first memory die 104 when the write request 534 is performed and the temperature crossing engine 522 may refrain from performing the memory operations 166 prior to performing the read request 538. In the fourth case 708, the write temperature 546 (e.g., hot) and the read temperature 548 (e.g., hot) may both be greater than the second temperature threshold 544. The temperature crossing engine 522 may refrain from performing the memory operations 166 prior to performing the write request 534 and may also refrain from performing the memory operations 166 prior to performing the read request 538. A temperature (e.g., hot) of the first memory die 104 when the read request 538 is performed may be substantially similar to a temperature (e.g., hot) of the first memory die 104 when the write request 534 is performed without performing the memory operations 166.

The temperature crossing engine 522 may reduce a bit-error rate in at least one of the first case 702, the second case 704, or the third case 706 by performing the memory operations 166 prior to the write request 534, performing the memory operations 166 prior to the read request 538, or both.

It should be understood that the first case 702, the second case 704, the third case 706, and the fourth case 708 are provided as illustrative, non-limiting examples. In some implementations, the temperature crossing engine 522 may use other cases to determine whether the first memory die 104 has a characteristic indicative of the temperature crossing condition 528. For example, the temperature crossing engine 522 may, prior to performing the write request 534, determine that the first memory die 104 has a characteristic indicative of the temperature crossing condition 528 in response to determining that the write temperature 546 is less than or equal to the second temperature threshold 544. In this example, the temperature crossing engine 522 may, prior to performing the read request 538, determine that the first memory die 104 has a characteristic indicative of the temperature crossing condition 528 in response to determining that the read temperature 548 is less than or equal to the second temperature threshold 544. In this example, a temperature (e.g., hot) of the first memory die 104 when the write request 534 is performed may be substantially similar to a temperature (e.g., hot) of the first memory die 104 when the read request 538 is performed. The temperature crossing engine 522 may reduce a bit-error rate by performing the memory operations 166 prior to the write request 534, performing the memory operations 166 prior to the read request 538, or both.

Figure 8:
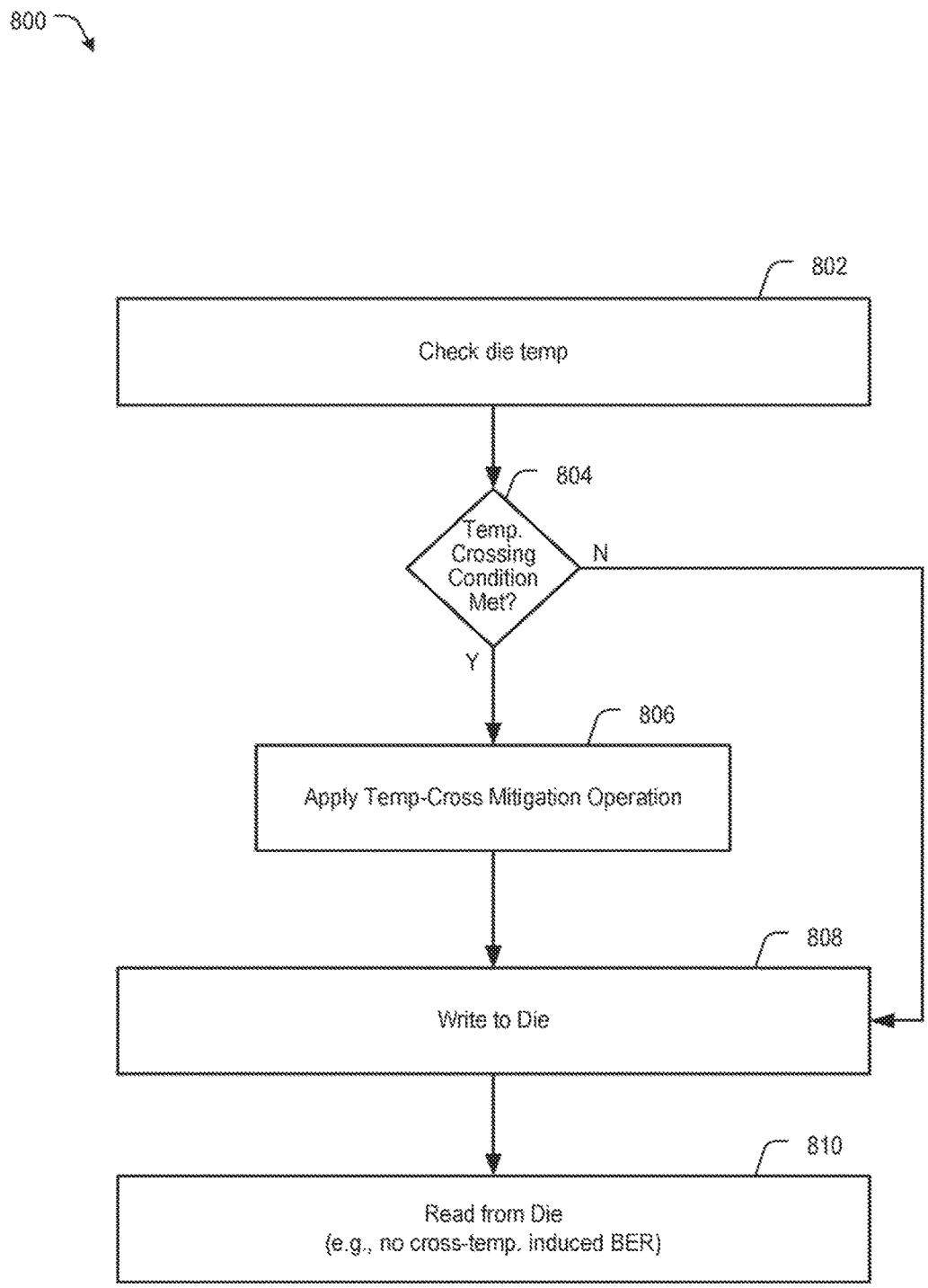
FIG. 8 is a diagram of a particular illustrative example of a method of operation of the device of FIG. 5.

Referring to FIG. 8, an illustrative example of a method is depicted and generally designated 800. The method 800 may be performed by the device 102, the controller 120 of FIG. 1, the temperature crossing engine 522, the system 500 of FIG. 5, or a combination thereof.

The method 800 includes checking die temperature, at 802. For example, the temperature crossing engine 522 of FIG. 5 may determine the write temperature 546 based on the sensor input 156, as described with reference to FIG. 5. The sensor input 156 may indicate the temperature 158 at or proximate to the first memory die 104.

The method 800 also includes determining whether a temperature crossing condition is met, at 804. For example, the temperature crossing engine 522 of FIG. 5 may determine whether the temperature crossing condition 528 is detected, as described with reference to FIGS. 5-7.

The method 800 includes, in response to determining that the temperature crossing condition is met, at 804, applying a temperature crossing mitigation operation, at 806. For example, the temperature crossing engine 522 of FIG. 5 may, in response to detecting the temperature crossing condition 528, perform the memory operations 166 until the temperature condition 526 is detected, as further described with reference to FIGS. 5-6. The method 800 includes, in response to determining that the temperature crossing condition is not met, at 804, proceeding to 808.

The method 800 also includes performing one or more memory access operations while the temperature crossing condition is not met (e.g., after performing the 806). For example, the method 800 may include writing to a die, at 808. For example, the controller 120 may perform the write request 534 at the first memory die 104, as described with reference to FIG. 5.

As another example, the method 800 may include reading from the die, at 810. For example, the controller 120 may perform the read request 538 at the first memory die 104, as described with reference to FIG. 5.

The method 800 may, by heating the first memory die 104 prior to writing the data, prior to reading the data, or both, reduce a difference between a first temperature at which data is read from the first memory die 104 and a second temperature at which data is written to the first memory die 104. For example, the first temperature may be substantially similar (e.g., warm) to the second temperature. The reduction in (e.g., elimination of) the temperature difference may reduce a bit-error rate associated with performing data reads at the memory device 103.

Figure 9:
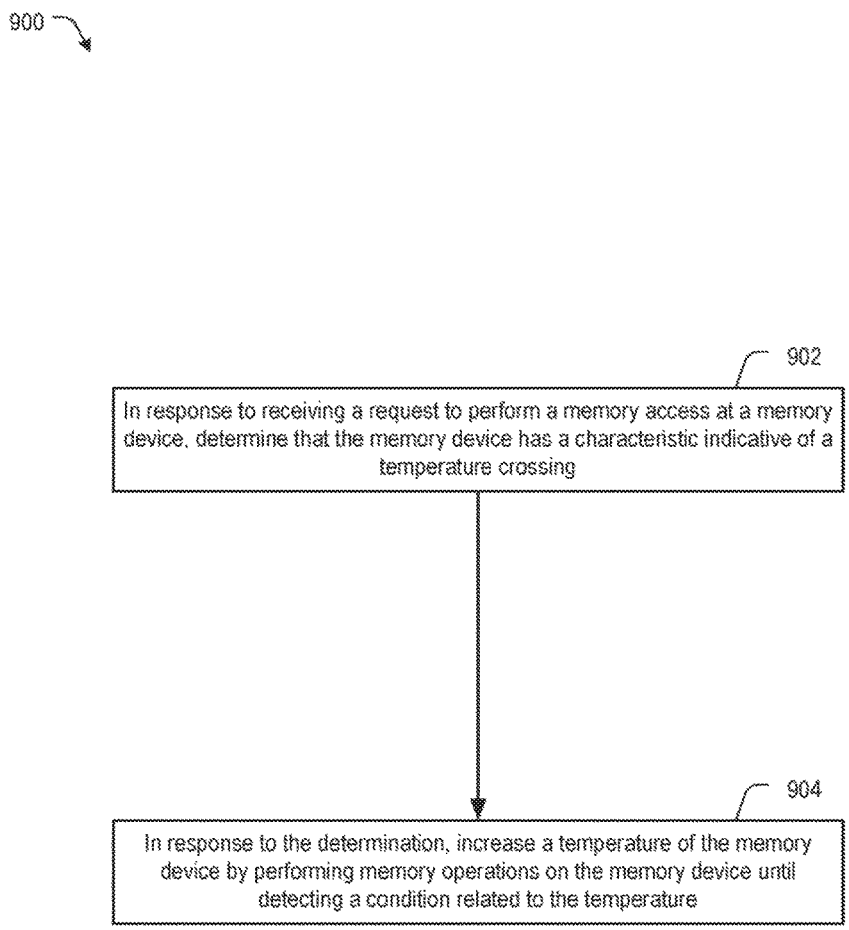
FIG. 9 is a diagram of another illustrative example of a method of operation of the device of FIG. 5.

Referring to FIG. 9, an illustrative example of a method is depicted and generally designated 900. The method 900 may be performed by the device 102, the controller 120 of FIG. 1, the temperature crossing engine 522, the system 500 of FIG. 5, or a combination thereof.

The method 900 includes, in response to receiving a request to perform a memory access at a memory device, determining that the memory device has a characteristic indicative of a temperature crossing, at 902. For example, the temperature crossing engine 522 of FIG. 5 may, in response to receiving a request (e.g., the read request 536 or the write request 532) to perform a memory access (e.g., the write request 534 or the read request 538), determine that the memory device 103 has a characteristic indicative of a temperature crossing, as described with reference to FIGS. 5-7.

The method 900 also includes, in response to the determination, increasing a temperature of the memory device by performing memory operations on the memory device until detecting a condition related to the temperature, at 904. For example, the temperature crossing engine 522 of FIG. 5 may, in response to determining that the memory device 103 has a characteristic indicative of a temperature crossing, perform the memory operations 166 until detecting the temperature condition 526, as further described with reference to FIGS. 5-7.

The method 900 may correspond to one or more of the cases of FIGS. 6-7. The method 900 may, by heating the first memory die 104 prior to a data write, prior to a data read, or both, reduce a difference between a first temperature at which data is read from the first memory die 104 and a second temperature at which data is written to the first memory die 104. For example, the first temperature may be substantially similar to the second temperature. The reduction in (e.g., elimination of) the temperature difference may reduce a bit-error rate associated with performing data reads at the memory device 103.

In some implementations, a computer-readable medium stores instructions executable by a processing module to perform operations. For example, the computer-readable medium may correspond to the memory 140, the instructions may correspond to the instructions 162, and the processing module may correspond to the healing engine 122, the temperature crossing engine 522, or both. The operations include determining that at least one storage element (e.g., the first storage element 110) of a memory die (e.g., the first memory die 104) has a characteristic indicative of an aging condition (e.g., the aging condition 128) during execution of the instructions by the processing module. The operations further include, responsive to determining that the at least one storage element (e.g., the first storage element 110) has the characteristic indicative of the aging condition (e.g., the aging condition 128), performing memory operations (e.g., the memory operations 166) to increase the temperature of the memory die (e.g., the first memory die 104) until detecting a condition (e.g., the temperature condition 126) related to the temperature of the memory die (e.g., the first memory die 104).

In a particular aspect, the operations include, prior to performing a memory access (e.g., the write request 534 or the read request 538) at a memory device (e.g., the memory device 103), determining that the memory device (e.g., the memory device 103) has a characteristic indicative of a temperature crossing (e.g., the temperature crossing condition 528). The operations also include, in response to the determination, increasing a temperature (e.g., the temperature 158) of the memory device (e.g., the memory device 103) by performing memory operations (e.g., the memory operations 166) at the memory device (e.g., the memory device 103) until detecting a condition related to the temperature (e.g., the temperature condition 526).

Although various components depicted herein are illustrated as block components and described in general terms, such components may include one or more microprocessors, state machines, or other circuits configured to enable such components to perform one or more operations described herein. For example, the temperature condition 126, the aging condition 128, or both, may represent physical components, such as hardware controllers, state machines, logic circuits, or other structures, to enable the healing engine 122 to detect the temperature condition 126, the aging condition 128, or both. As another example, the healing engine 122 may represent physical components, such as hardware controllers, state machines, logic circuits, or other structures, to enable the controller 120 to increase a temperature of a memory die (e.g., a first memory die 104) until the temperature condition 126 is detected. The temperature of the first memory die 104 may be increased responsive to determining that at least one storage element has a characteristic indicative of the aging condition 128.

In a particular aspect, the temperature condition 526, the temperature crossing condition 528, or both, may represent physical components, such as hardware controllers, state machines, logic circuits, or other structures, to enable the temperature crossing engine 522 to detect the temperature condition 526, the temperature crossing condition 528, or both. In a particular aspect, the temperature crossing engine 522 may represent physical components, such as hardware controllers, state machines, logic circuits, or other structures, to enable the controller 120 to increase a temperature of a memory die (e.g., a first memory die 104) until the temperature condition 526 is detected. The temperature of the first memory die 104 may be increased, prior to performing a memory access (e.g., the write request 534 or the read request 538), responsive to determining that the first memory die 104 has a characteristic indicative of the temperature crossing condition 528.

Alternatively or in addition, one or more components described herein may be implemented using a microprocessor or microcontroller programmed to perform operations, such as one or more operations of the method 300 of FIG. 3, the method 400 of FIG. 4, the method 800 of FIG. 8, the method 900 of FIG. 9, or a combination thereof. Instructions executed by the healing engine 122, the temperature crossing engine 522, the controller 120 and/or the device 102 may be retrieved from the memory 140 or from a separate memory location that is not part of the memory 140, such as from a read-only memory (ROM).

In conjunction with one or more of the described aspects of FIGS. 1-9, an apparatus includes means for communicating with a memory device that includes a plurality of memory dies. For example, the means for communicating may include or correspond to the interface 118 of FIG. 1, one or more other structures, devices, circuits, modules, or a combination thereof. The apparatus also includes means for increasing the temperature of a first die of the plurality of memory dies by performing memory operations on the first die until detecting a condition related to the temperature. The means for increasing the temperature of the first die may include the healing engine 122 of FIG. 1, one or more other structures, devices, circuits, modules, instructions for increasing the temperature of the first die, or a combination thereof. The temperature may be increased responsive to determining that at least one storage element of the first die has a characteristic indicative of an aging condition.

The device 102 may be coupled to, attached to, or embedded within one or more access devices, such as within a housing of the device 504. For example, the device 102 may be embedded within the device 504 in accordance with a Joint Electron Devices Engineering Council (JEDEC) Solid State Technology Association Universal Flash Storage (UFS) configuration. To further illustrate, the device 102 may be integrated within an electronic device, such as a mobile telephone, a computer (e.g., a laptop, a tablet, or a notebook computer), a music player, a video player, a gaming device or console, a component of a vehicle (e.g., a vehicle console), an electronic book reader, a personal digital assistant (PDA), a portable navigation device, or other device that uses internal non-volatile memory.

In one or more other implementations, the device 102 may be implemented in a portable device configured to be selectively coupled to one or more external devices, such as a host device (e.g., the device 504). For example, the device 102 may be removable from the device 504 (i.e., "removably" coupled to the device 504). As an example, the device 102 may be removably coupled to the device 504 in accordance with a removable universal serial bus (USB) configuration.

In some implementations, the system 100, the system 500, the device 102, or the memory 140 may be integrated within a network-accessible data storage system, such as an enterprise data system, an NAS system, or a cloud data storage system, as illustrative examples.

In some implementations, the device 102 may include a solid state drive (SSD). The device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the device 102 may be coupled to another device (e.g., the device 504) via a network. For example, the network may include a data center storage system network, an enterprise storage system network, a storage area network, a cloud storage network, a local area network (LAN), a wide area network (WAN), the Internet, and/or another network.

To further illustrate, the device 102 may be configured to be coupled to another device (e.g., the device 504) as embedded memory, such as in connection with an embedded MultiMedia Card (eMMC®) (trademark of JEDEC Solid State Technology Association, Arlington, Va.) configuration, as an illustrative example. The device 102 may correspond to an eMMC device. As another example, the device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The device 102 may operate in compliance with a JEDEC industry specification. For example, the device 102 may operate in compliance with a JEDEC eMMC specification, a JEDEC Universal Flash Storage (UFS) specification, one or more other specifications, or a combination thereof.

The memory 140 may include a resistive random access memory (ReRAM), a flash memory (e.g., a NAND memory, a NOR memory, a SLC flash memory, a MLC flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the device 102 is indirectly coupled to an access device via a network. For example, the device 102 may be a network-attached storage (NAS) device or a component (e.g., a solid-state drive (SSD) component) of a data center storage system, an enterprise storage system, or a storage area network. The memory 140 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device, comprising:
a memory device; and
a controller coupled to the memory device, the controller including:
a temperature crossing engine, wherein the temperature crossing engine is configured to determine a read temperature, wherein the temperature crossing engine is configured to determine, based on a write temperature, whether a die has a characteristic indicative of a temperature crossing condition;
an interface; and
memory.

2. The data storage device of claim 1, wherein the temperature crossing engine is configured to store the determined read temperature in the memory.

3. The data storage device of claim 2, wherein the temperature crossing engine is configured to determine a write temperature.

4. The data storage device of claim 3, wherein the temperature crossing engine is configured to store the determined write temperature in the memory.

5. The data storage device of claim 4, wherein the temperature crossing engine is configured to determine a write temperature satisfies a first temperature threshold.

6. The data storage device of claim 5, wherein the temperature crossing engine is configured to determine a write temperature fails to satisfy a second temperature threshold.

7. The data storage device of claim 1, wherein the temperature crossing engine is configured to determine a write temperature.

8. The data storage device of claim 7, wherein the temperature crossing engine is configured to store the determined write temperature in the memory.

9. The data storage device of claim 1, wherein the temperature crossing engine is configured to determine a write temperature satisfies a first temperature threshold.

10. The data storage device of claim 9, wherein the temperature crossing engine is configured to determine a write temperature fails to satisfy a second temperature threshold.

11. A method, comprising:
checking a die temperature;
determining that a temperature crossing condition is met;
applying a temperature crossing mitigation operating;
writing data to the die; and
reading data from the die.

12. The method of claim 11, wherein the determining includes determining that the checked die temperature is greater than a temperature threshold.

13. The method of claim 11, wherein the applying comprises performing memory operations until a temperature condition is met.

14. The method of claim 11, wherein prior to writing the data to the die, heating the die.

15. The method of claim 11, wherein prior to reading the data from the die, heating the die.

16. A data storage device, comprises:
a memory device; and
a controller coupled to the memory device, the controller including:
means to determine a read temperature; and
means to determine, based on a write temperature, whether a die has a characteristic indicative of a temperature crossing condition.

17. The data storage device of claim 16, further comprising means to heat a memory die.

18. The data storage device of claim 17, further comprising:
means to determine a write temperature; and
means to determine a read temperature.

19. The data storage device of claim 16, further comprising:
means to determine a write temperature satisfies a first temperature threshold; and
means to determine a write temperature fails to satisfy a second temperature threshold.

20. The data storage device of claim 16, further comprising means to perform memory operations until a temperature condition is met.

* * * * *